US012777787B2

(12) United States Patent
Kim et al.

(10) Patent No.: US 12,777,787 B2
(45) Date of Patent: Oct. 27, 2026

(54) DISPLAY DEVICE

(71) Applicant: Samsung Display Co., LTD., Yongin-si (KR)

(72) Inventors: Daesoo Kim, Seoul (KR); Daewon Choi, Cheonan-si (KR); Yunjong Yeo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 956 days.

(21) Appl. No.: 17/888,604

(22) Filed: Aug. 16, 2022

(65) Prior Publication Data

US 2023/0055419 A1 Feb. 23, 2023

(30) Foreign Application Priority Data

Aug. 17, 2021 (KR) ........................ 10-2021-0108202

(51) Int. Cl.

*H10K 59/13* (2023.01)
*H10K 50/858* (2023.01)
*H10K 59/131* (2023.01)
*H10K 59/124* (2023.01)

(52) U.S. Cl.

CPC ......... *H10K 59/131* (2023.02); *H10K 50/858* (2023.02); *H10K 59/124* (2023.02)

(58) Field of Classification Search

CPC .. H10K 59/131; H10K 50/858; H10K 59/121; H10D 86/411; H10D 86/441; G06F 1/1637; G06F 1/1684; G06F 1/1686

See application file for complete search history.

(56) References Cited

U.S. PATENT DOCUMENTS 10,199,223 B2 * 2/2019 Pierreux ........... H01L 21/31144
2017/0090236 A1 * 3/2017 Yeh ....................... G02F 1/1368
2017/0205543 A1 7/2017 Yim et al.
2020/0243801 A1 7/2020 Xu et al.
2020/0251539 A1 8/2020 Fu
2021/0225265 A1 * 7/2021 Hong .................. H10K 59/121
(Continued)

FOREIGN PATENT DOCUMENTS

CN 111508377 A 8/2020
CN 112687193 A 4/2021
WO WO-2018163019 A1 * 9/2018 ........... G09G 3/2003

OTHER PUBLICATIONS

The Role of Tin Oxide Concentration—Hasan—2018 (Year: 2018).*
(Continued)

*Primary Examiner* — Phuc T Dang
(74) *Attorney, Agent, or Firm* — CANTOR COLBURN LLP

(57) ABSTRACT

A display device includes a display area, a pixel circuit area adjacent to the display area, and a functional module area between the display area and the pixel circuit area. An inorganic insulating layer is in the display area. A light phase compensation layer is in the functional module area and includes a same material as the inorganic insulating layer. A signal line is disposed in the functional module area, on the light phase compensation layer, and extends from the functional module area to the pixel circuit area. The organic insulating layer is on the inorganic insulating layer and extends from the display area to the functional module area to cover the signal line and the light phase compensation layer.

19 Claims, 18 Drawing Sheets

(56) References Cited

U.S. PATENT DOCUMENTS

| | | | |
|---|---|---|---|
| 2021/0249624 | A1 | 8/2021 | Lou et al. |
| 2022/0173184 | A1 | 6/2022 | Jeong et al. |

OTHER PUBLICATIONS

Enhanced sensitivity of silicon-photonics-based ultrasound detection via BCB coating (arXiv1901.03987)—Kumar (Year: 2019).*

European Search Report for European Patent Application No. 22190870.0 dated Jan. 30, 2023.

* cited by examiner

DISPLAY DEVICE

This application claims priority to Korean Patent Application No. 10-2021-0108202, filed on Aug. 17, 2021, and all the benefits accruing therefrom under 35 U.S.C. § 119, which is hereby incorporated by reference for all purposes as if fully set forth herein.

BACKGROUND

1. Field

Embodiments relate generally to a display device. More particularly, embodiments relate to a display device that provides visual information.

2. Description of the Related Art

A flat panel display device is used as a display device replacing a cathode ray in a display device, due to characteristics such as light weight and thinness. Representative examples of such flat panel display devices are a liquid crystal display device ("LCD") and an organic light emitting display device ("OLED").

The display device may include a module-corresponding area in which a functional module is disposed, and a display area surrounding the module-corresponding area and in which emission structures are disposed. Here, the functional module may be disposed on a lower surface of a substrate included in the display device. A display device capable of displaying an image by arranging emission structures in the module-corresponding area has been developed.

SUMMARY

Embodiment provides a display device with improved display quality.

An embodiment of a display device includes a substrate including a (functional) module-corresponding area, a display area adjacent to the module-corresponding area, and a pixel circuit area at a side of the display area, an inorganic insulating layer in the display area on the substrate, a (light) phase compensation layer in the module-corresponding area, on the substrate, and including a same material as the inorganic insulating layer, a signal line in the module-corresponding area, on the phase compensation layer and extending from the module-corresponding area to the pixel circuit area, and an organic insulating layer on the inorganic insulating layer and extending from the display area to the module-corresponding area to cover the signal line and the phase compensation layer.

In an embodiment, the display device may further include an etch stop layer in the module-corresponding area, between the substrate and the phase compensation layer, and including a transparent material.

In an embodiment, an etch rate of the etch stop layer may be smaller than an etch rate of the phase compensation layer.

In an embodiment, the etch stop layer may include indium gallium zinc oxide ("IGZO") or amorphous silicon.

In an embodiment, the etch stop layer may be in an entirety of the module-corresponding area.

In an embodiment, the etch stop layer may be a pattern which overlaps each of the phase compensation layer and the signal line.

In an embodiment, the signal line may include a conductive metal oxide or a transparent conductive material.

In an embodiment, the transparent conductive material may include indium tin oxide ("ITO"), indium zinc oxide ("IZO") or indium gallium oxide ("IGO").

In an embodiment, the inorganic insulating layer may include silicon oxide or silicon nitride.

In an embodiment, a refractive index of the organic insulating layer may be greater than a refractive index of the phase compensation layer and smaller than a refractive index of the signal line.

In an embodiment, a refractive index of the signal line may be about 1.9 or more.

In an embodiment, the display device may further include a functional module in the module-corresponding area, on a lower surface of the substrate.

In an embodiment, the functional module may include a camera module, a face recognition sensor module, a pupil recognition sensor module, an acceleration sensor module, a proximity sensor module, an infrared sensor module or an illuminance sensor module.

In an embodiment, the display device may further include a pixel circuit structure in the pixel circuit area, on the substrate, and including a semiconductor element, and an emission structure in the module-corresponding area, on the substrate.

In an embodiment, the signal line may electrically connect the pixel circuit structure and the emission structure.

An embodiment of a display device includes a substrate including a module-corresponding area, a display area adjacent to the module-corresponding area, and a pixel circuit area at a side of the display area, a first inorganic insulating layer on the display area and the module-corresponding area, on the substrate, a second inorganic insulating layer in the display area, on the first inorganic insulating layer, a phase compensation layer in the module-corresponding area, on the substrate, and including a same material as the second inorganic insulating layer, a signal line in the module-corresponding area, on the phase compensation layer, and extending from the module-corresponding area to the pixel circuit area, and an organic insulating layer on the second inorganic insulating layer and extending from the display area to the module-corresponding area to cover the signal line and the phase compensation layer.

In an embodiment, the display device may further include an etch stop layer in the module-corresponding area, on the first inorganic insulating layer, and including a transparent material.

In an embodiment, an etch rate of the etch stop layer may be smaller than an etch rate of the phase compensation layer.

In an embodiment, the etch stop layer may include indium gallium zinc oxide or amorphous silicon.

In an embodiment, each of the first inorganic insulating layer and the second inorganic insulating layer may silicon oxide or silicon nitride.

In one or more embodiment of a display device, as a light phase compensation layer including an inorganic insulating material is in a functional module area, an occurrence of a flare phenomenon may be reduced.

In addition, as a etch stop layer including a transparent material is in the functional module area between the substrate and the phase compensation layer, a non-uniformity of a thickness of the phase compensation layer in a large-area display device may be improved.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
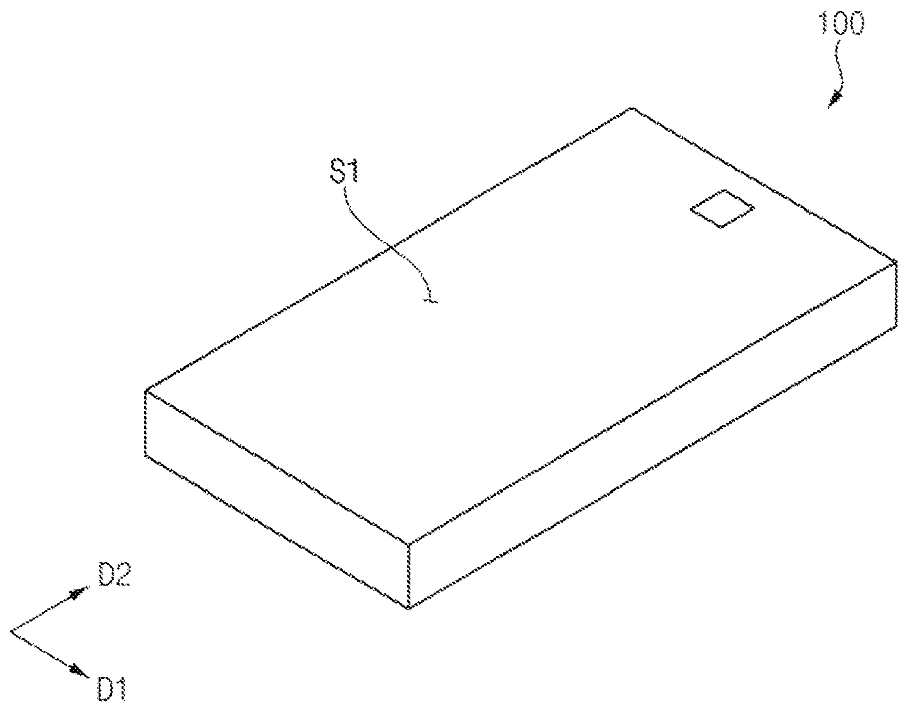
FIGS. 1 and 2 are perspective views illustrating an embodiment of a display device.

Hereinafter, embodiments of the present disclosure will be explained in detail with reference to the accompanying drawings. The same reference numerals are used for the same components in the drawings, and redundant descriptions of the same components will be omitted.

It will be understood that when an element is referred to as being related to another element such as being "on" another element, it can be directly on the other element or intervening elements may be present therebetween. In contrast, when an element is referred to as being related to an element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
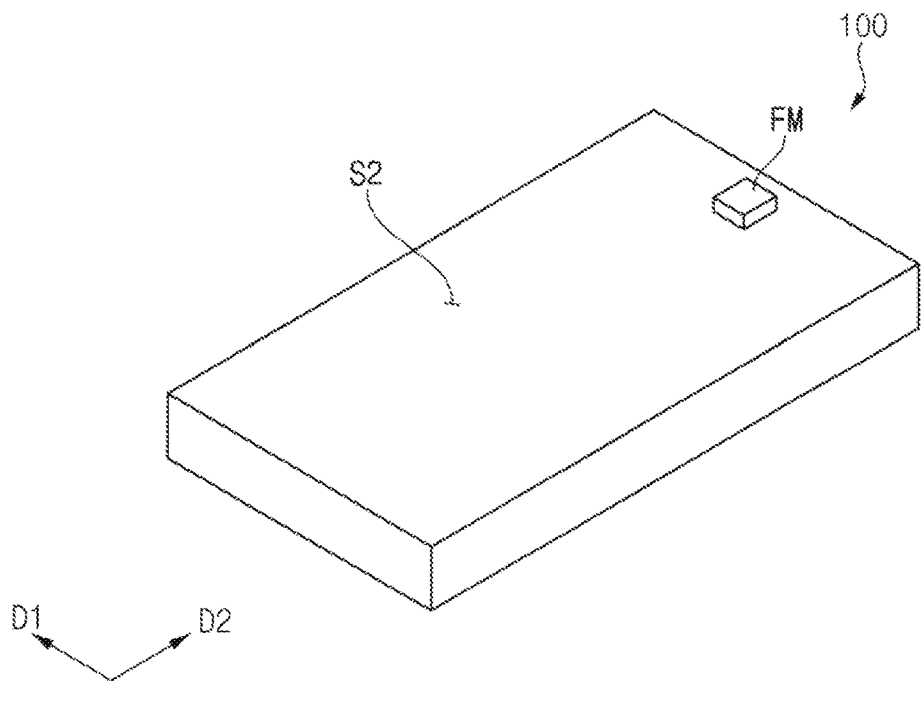
Figure 3:
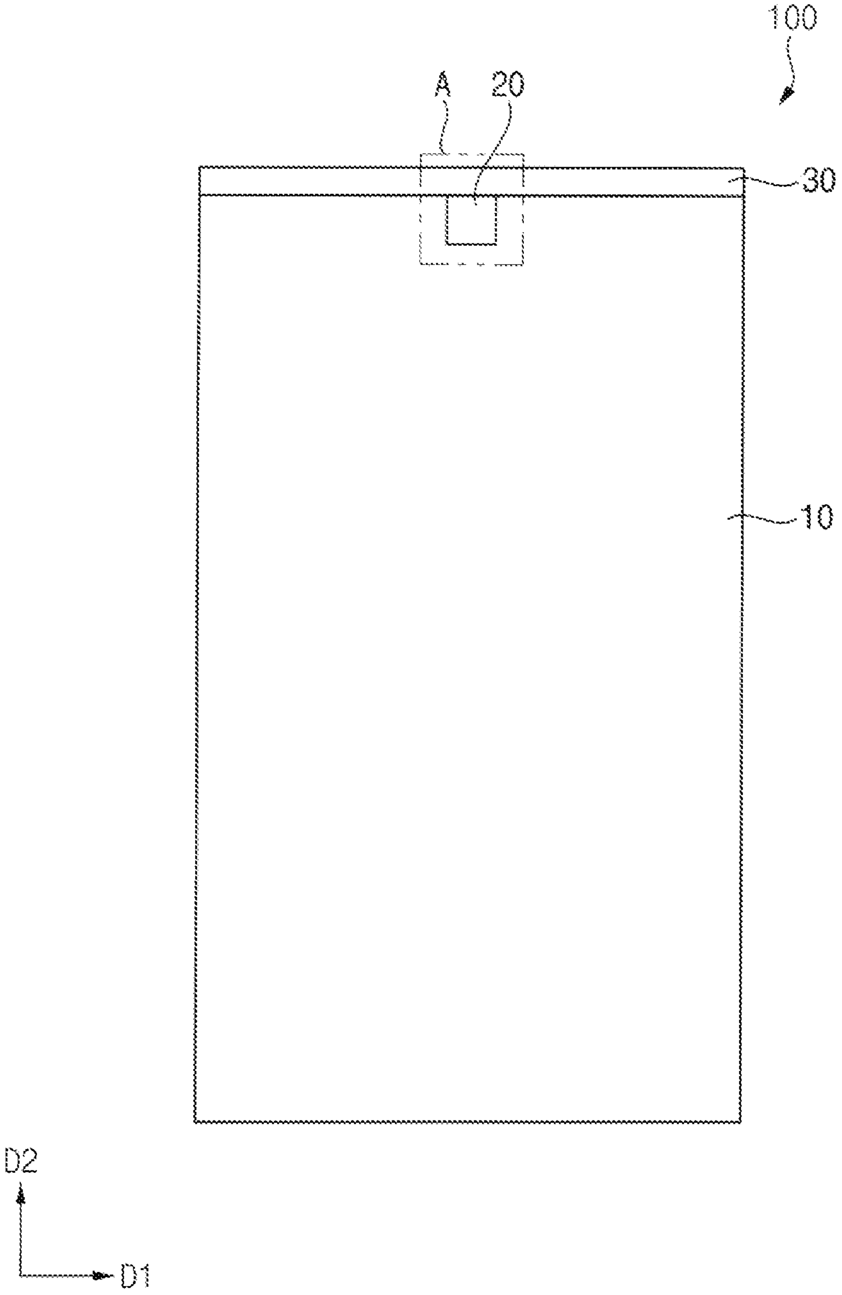
FIG. 3 is a plan view illustrating the display device of FIG. 1.

FIGS. 1 and 2 are perspective views illustrating an embodiment of a display device 100 FIG. 3 is a plan view illustrating the display device 100 of FIG. 1.

Referring to FIGS. 1, 2, and 3, the display device 100 may include a display area 10, a module-corresponding area 20 (e.g., functional module area), and a pixel circuit area 30.

The display area 10 is adjacent to the module-corresponding area 20 and may surround at least a portion of the module-corresponding area 20. The pixel circuit area 30 may be positioned at one side of the display area 10. In addition, the pixel circuit area 30 may be adjacent to one side of the module-corresponding area 20. That is, first to third sides of the module-corresponding area 20 may be adjacent to the display area 10, and a fourth side of the module-corresponding area 20 may be adjacent to the pixel circuit area 30, so as to be surrounded by the display area 10 together with the pixel circuit area 30.

The display device 100 may be divided into (or include) a first surface S1 and a second surface S2. The first surface S1 may correspond to a surface on which an image is displayed (e.g., display surface). The second surface S2 may correspond to a surface on which an image is not displayed.

The module-corresponding area 20 may be in and form a part of the display area 10. An image may be displayed and/or light may be emitted at the module-corresponding area 20, without being limited thereto.

The display device 100 may include a functional module FM. The functional module FM may be disposed to overlap (or correspond to) the module-corresponding area 20, on the second surface S2. In an embodiment, an image may be displayed at both a portion of the first surface S1 overlapping the module-corresponding area 20 and a portion of the first surface S1 overlapping the display area 10. In an embodiment, for example, the functional module FM may provide a function to the display device 100 and may include a camera module, a face recognition sensor module, a pupil recognition sensor module, an acceleration sensor module, a proximity sensor module, an infrared sensor module, an illuminance sensor module, and the like. In an embodiment, the functional module FM may include the camera module. In this case, the functional module FM may capture an image by capturing external light incident to the display device 100 through a portion of the first surface S1 overlapping the module-corresponding area 20, to provide an image-capturing function to the display device 100.

However, although a shape of the functional module FM is shown as having a rectangular planar shape, the planar shape of the functional module FM is not limited thereto. In an embodiment, for example, the functional module FM may have a triangular planar shape, a rhombus planar shape, a polygonal planar shape, a track-type planar shape, a circular planar shape, or an elliptical planar shape. In addition, when a planar shape of the functional module FM is changed, a planar shape of the module-corresponding area 20 may also be changed according to an outer shape of the functional module FM.

Figure 4:
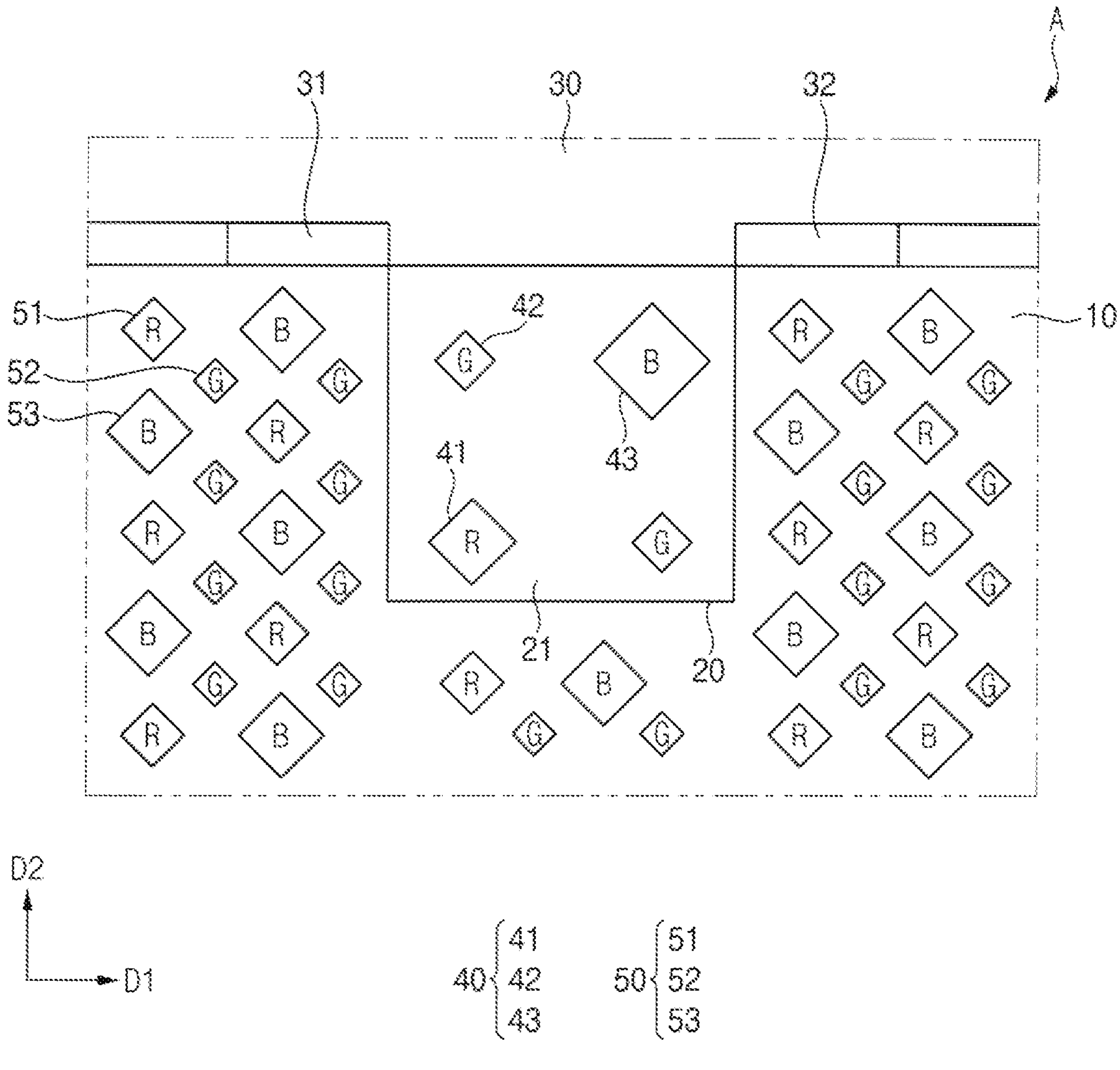
FIGS. 4 and 5 are partially enlarged plan views illustrating an embodiment of area 'A' of FIG. 3.
Figure 5:
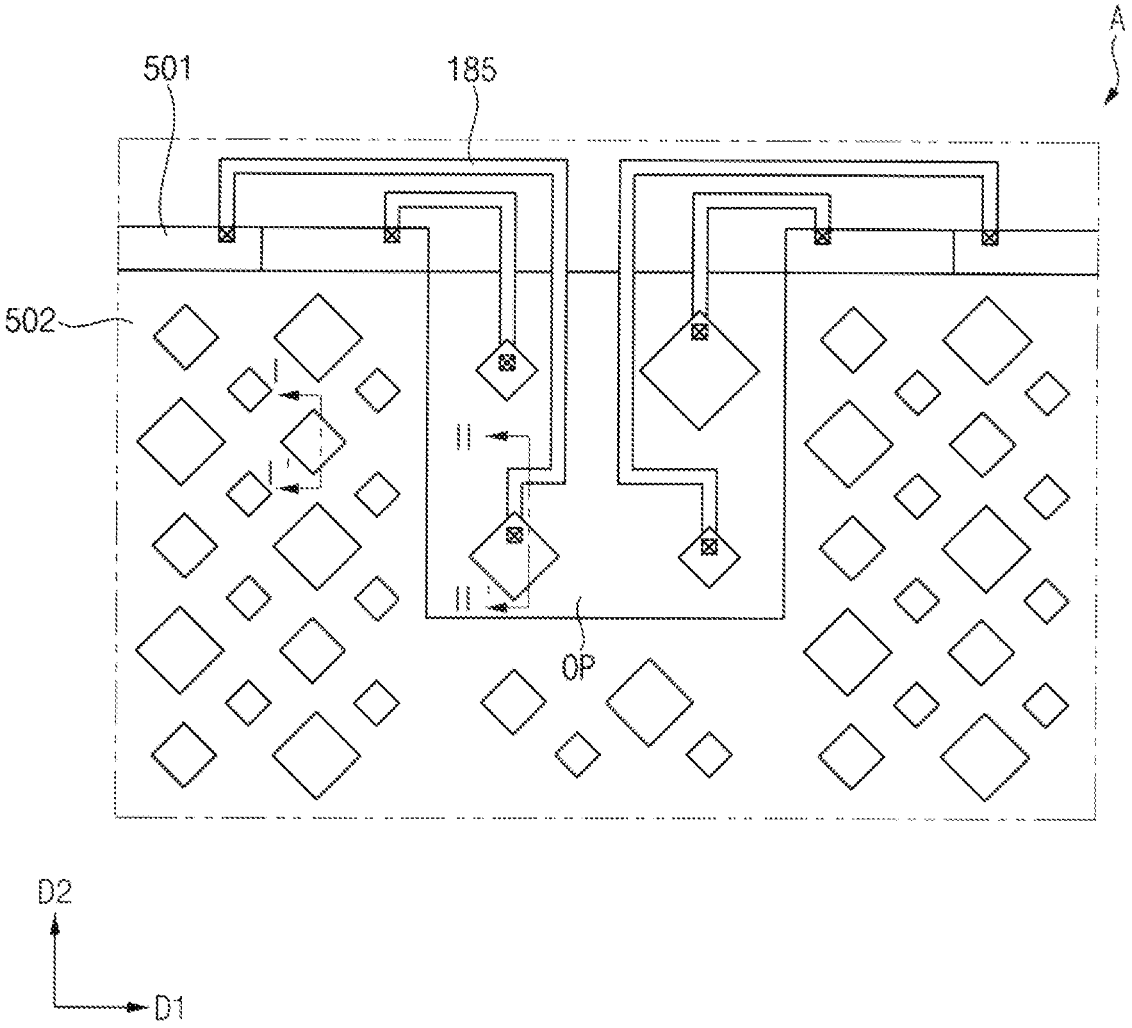

FIGS. 4 and 5 are partially enlarged plan views illustrating embodiments of area 'A' of FIG. 3.

Referring to FIG. 4, the display area 10 may include (or correspond to) a second pixel area 50, and the module-corresponding area 20 may include a transparent area 21 and a first pixel area 40. In addition, the pixel circuit area 30 may include a first pixel circuit area 31 provided in plural including a plurality first pixel circuit areas 31 and a second pixel circuit area 32 provided in plural including a plurality of second pixel circuit areas 32.

The second pixel area 50 may include a plurality of second sub-pixel areas 51, 52, and 53 emitting light of different colors. The first pixel area 40 may include a plurality of first sub-pixel areas 41, 42, and 43 emitting light of different colors. The lights of different colors may be used to display an image within the display area 10, without being limited thereto. The pixel area (or sub-pixel area) may otherwise be referred to as a light emission area.

In an embodiment, for example, the second sub-pixel areas 51, 52, and 53 may include a second red pixel area 51 in which a red emission structure R (e.g., a second emission structure 400 of FIG. 6) emitting red light is disposed, a second green pixel area 52 in which a green emission structure G emitting green light is disposed, and a second blue pixel area 53 in which a blue emission structure B emitting blue light is disposed. In addition, the first sub-pixel areas 41, 42, and 43 may include a first red pixel area 41 in which a red emission structure R (e.g., a first emission structure 300 of FIG. 6) emitting red light is disposed, a first green pixel area 42 in which a green emission structure G emitting green light is disposed, and a first blue pixel area 43 in which a blue emission structure B emitting blue light is disposed.

The plurality of second sub-pixel areas 51, 52, and 53 may be repeatedly arranged in the display area 10. The plurality of first sub-pixel areas 41, 42, and 43 may be repeatedly arranged in the module-corresponding area 20. That is, the emission structures R, G, and B may be repeatedly arranged in the display area 10, and the emission structures R, G, and B may be repeatedly arranged in the module-corresponding area 20.

In the module-corresponding area 20, a portion other than the plurality of first sub-pixel areas 41, 42, and 43 (e.g., remaining portion of the module-corresponding area 20) may be defined as the transparent area 21. An opening OP may be positioned in the transparent area 21. In addition, the functional module FM may collect light incident from an outside through the opening OP.

The first pixel circuit areas 31 may be positioned adjacent to a first portion (e.g., the display area 10 positioned to a left of the module-corresponding area 20 in FIG. 4) of the display area 10 in the pixel circuit area 30, and may be arranged along a first direction D1. The second pixel circuit areas 32 may be positioned adjacent to a second portion (e.g., the display area 10 positioned to a right of the module-corresponding area 20 in FIG. 4) of the display area 10 in the pixel circuit area 30, and may be arranged along the first direction D1. The pixel circuit area 30 may be adjacent to both the display area 10 and the module-corresponding area 20 along a second direction D2 crossing the first direction D1. A thickness direction of the display device 100 and various components and layers thereof, may be defined along a third direction which crosses each of the first direction D1 and the second direction D2.

A pixel circuit structure (e.g., a first pixel circuit structure 501 of FIG. 5) electrically connected to an emission structure disposed in the module-corresponding area 20 may be disposed in the first and second pixel circuit areas 31 and 32. A pixel circuit structure (e.g., a second pixel circuit structure 502 of FIG. 5) electrically connected to an emission structure disposed in the display area 10 may be disposed in the display area 10. That is, a pixel circuit structure electrically connected to the emission structure disposed in the module-corresponding area 20 may not be disposed in the module-corresponding area 20 (e.g., may be excluded from the module-corresponding area 20).

Referring to FIG. 5, the second pixel circuit structure 502 may be disposed in the display area 10. The second pixel circuit structure 502 may include at least one semiconductor element 200 (see FIG. 6), at least one capacitor, and the like. The second pixel circuit structure 502 may drive the emission structure (e.g., the second emission structure 400 of FIG. 6). The second pixel circuit structure 502 may be disposed to overlap the emission structure and be under the emission structure along a thickness direction of the display device 100.

The first pixel circuit structure 501 may be disposed in the first and second pixel circuit areas 31 and 32. The first pixel circuit structure 501 may include at least one semiconductor element, at least one capacitor, and the like. The first pixel circuit structure 501 may drive the emission structure (e.g., the first emission structure 300 of FIG. 6). The first pixel circuit structure 501 and the emission structure may be electrically connected through a signal line 185.

Figure 6:
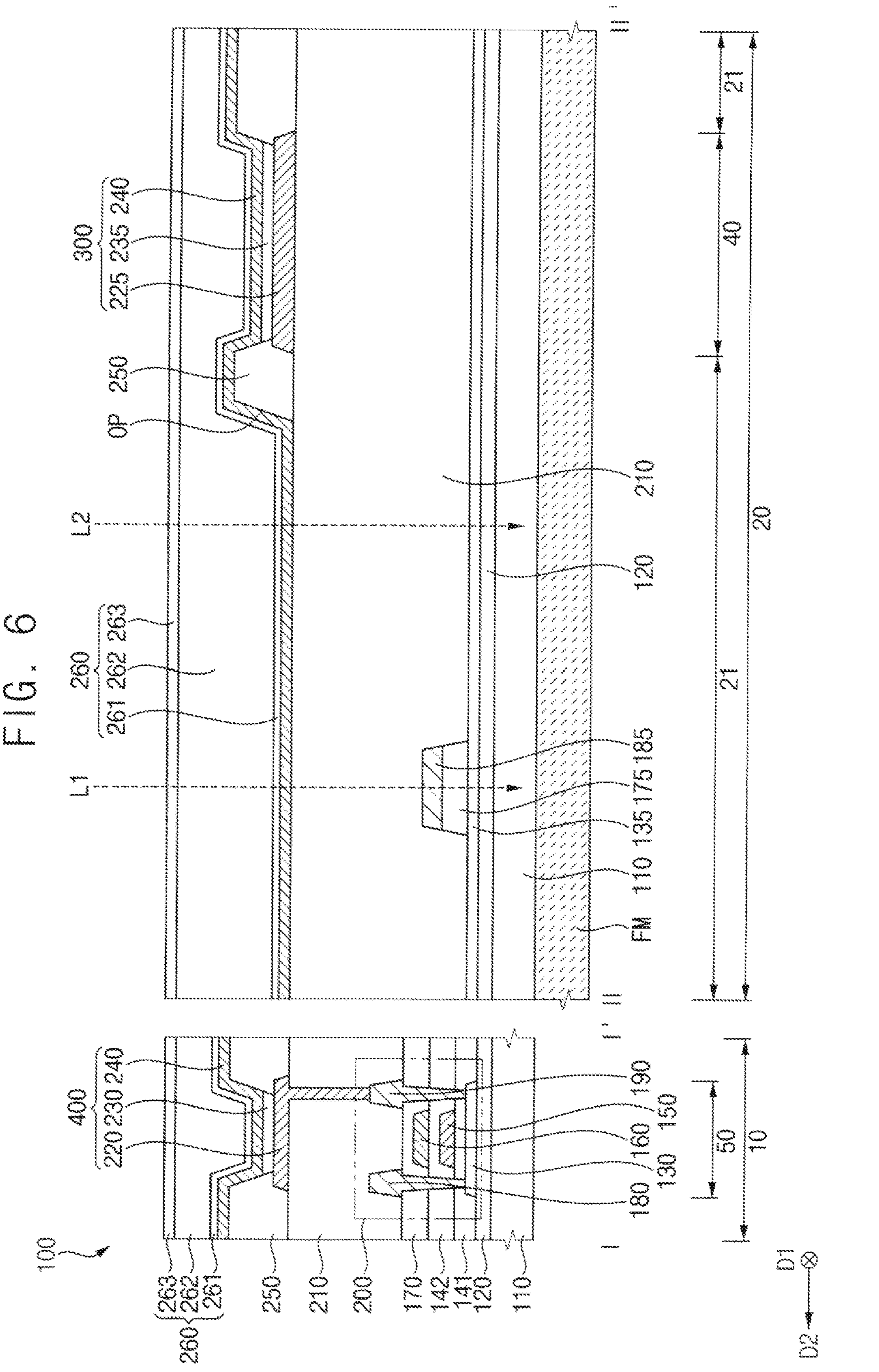
FIG. 6 is a cross-sectional view taken along lines I-I' and II-II' of FIG. 5.

FIG. 6 is a cross-sectional view taken along lines I-I' and II-II' of FIG. 5.

Referring to FIG. 6, the display device 100 may include a functional module FM, a substrate 110, a buffer layer 120, a semiconductor element 200, a first gate insulating layer 141, a second gate insulating layer 142, an interlayer insulating layer 170, a phase compensation layer 175, a signal line 185, an etch stop layer 135, a planarization layer 210, a pixel defining layer 250, a first emission structure 300, a second emission structure 400 and a thin film encapsulation structure 260.

Here, the semiconductor element 200 may include an active layer 130, a first gate electrode 150, a second gate electrode 160, a source electrode 180, and a drain electrode 190. The first emission structure 300 may include a first lower electrode 225, a first emission layer 235 and an upper electrode 240. The second emission structure 400 may include a second lower electrode 220, a second emission layer 230 and the upper electrode 240. In addition, the thin film encapsulation structure 260 may include a first inorganic thin film encapsulation layer 261, an organic thin film encapsulation layer 262, and a second inorganic thin film encapsulation layer 263.

As described in FIG. 1, as the display device 100 includes the display area 10, the module-corresponding area 20 and the pixel circuit area 30, the substrate 110 may also include the display area 10, the module-corresponding area 20 and the pixel circuit area 30 corresponding to those described above. That is, various components and layers of the display device 100 may also include the display area 10, the module-corresponding area 20 and the pixel circuit area 30 corresponding to those described above for the display device 100.

The substrate 110 may include a transparent material or an opaque material. In an embodiment, for example, the substrate 110 may include a quartz substrate, a synthetic quartz substrate, a calcium fluoride substrate, an F-doped quartz substrate, and a soda-lime glass. It may include a glass substrate, a non-alkali glass substrate, and the like. These may be used alone or in combination with each other. In an embodiment, the substrate 110 may be formed of (or include) a flexible transparent resin substrate. In an embodiment, for example, the substrate 110 may have a structure in which a first organic layer, a first barrier layer, a second organic layer, and a second barrier layer are sequentially stacked. Each of the first barrier layer and the second barrier layer may include an inorganic material such as silicon oxide. Each of the first organic layer and the second organic layer may include an organic insulating material such as a polyimide-based resin, and may have flexibility.

However, although the substrate 110 has been described as having four layers, the configuration of the substrate 110 is not limited thereto. In an embodiment, for example, the substrate 110 may have a single layer or a plurality of layers.

The functional module FM may be disposed in the module-corresponding area 20, on the lower surface of the substrate 110 which is furthest from the various emission structures. The functional module FM may directly contact the lower surface of the substrate 110. As being in direct contact, elements may form an interface or boundary therebetween, without being limited thereto. In an embodiment, for example, the functional module FM may include the camera module. The camera module may collect light incident from outside of the display device 100, and the display device 100 may obtain an image from the camera module.

The buffer layer 120 may be disposed on the substrate 110. That is, the buffer layer 120 may be disposed in an entirety of the display area 10 and an entirety of the module-corresponding area 20. The buffer layer 120 may prevent diffusion of metal atoms or impurities from the substrate 110 to the semiconductor element 200. In addition, when a surface of the substrate 110 is not uniform, the buffer layer 120 may serve to improve the flatness of the surface of the substrate 110. In an embodiment, for example, the buffer layer 120 may include silicon oxide ($SiO_x$), silicon nitride ($SiN_x$), and the like. These may be used alone or in combination with each other. In an embodiment, the buffer layer 120 may be disposed only in the display area 10 and may not be disposed in the module-corresponding area 20.

The active layer 130 may be disposed in the display area 10, on the buffer layer 120. Specifically, the active layer 130 may be disposed in the second pixel area 50 included in the display area 10. The active layer 130 may include a metal oxide semiconductor, an inorganic semiconductor (e.g., amorphous silicon, polysilicon) or an organic semiconductor. The active layer 130 may have a source region, a drain region, and a channel region positioned between the source region and the drain region in a direction along the substrate 110.

In an embodiment, the etch stop layer 135 may be disposed in the module-corresponding area 20, on the buffer layer 120. The etch stop layer 135 may be disposed in an entirety of the module-corresponding area 20. In addition, the etch stop layer 135 may be disposed on the same layer as the active layer 130. That is, the etch stop layer 135 may include the same material as the active layer 130. As being on a same layer, elements may be in a same layer as each other as respective portions of a same material layer, may form an interface with a same underlying or overlying layer, etc., without being limited thereto.

The etch stop layer 135 may include a transparent material. In an embodiment, the etch stop layer 135 may include indium gallium zinc oxide ("IGZO"), amorphous silicon, and the like. These may be used alone or in combination with each other. However, the material included in the etch stop layer 135 is not limited thereto, and the etch stop layer 135 may include other transparent materials.

In an embodiment, an etch rate of the etch stop layer 135 may be smaller than an etch rate of the phase compensation layer 175, which will be described later.

At least one inorganic insulating layer (e.g., the first gate insulating layer 141) may be disposed in the display area 10 on the buffer layer 120. The first gate insulating layer 141 may cover the active layer 130 in the display area 10 and may not be disposed in the module-corresponding area 20. In an embodiment, for example, the first gate insulating layer 141 may sufficiently cover the active layer 130 on the buffer layer 120, and may have a substantially flat top surface without creating a step around the active layer 130. In an embodiment, the first gate insulating layer 141 may cover the active layer 130 on the buffer layer 120, and may be disposed along a profile of the active layer 130 with a uniform thickness.

The first gate insulating layer 141 may include an inorganic insulating material. In an embodiment, for example, the first gate insulating layer 141 may include silicon oxide ($SiO_x$), silicon nitride ($SiN_x$), silicon carbide ($SiC_x$), silicon oxynitride ($SiO_xN_y$), silicon oxycarbide ($SiO_xC_y$), and the like. These may be used alone or in combination with each other.

The first gate electrode 150 may be disposed in the display area 10 on the first gate insulating layer 141. Specifically, the first gate electrode 150 may be disposed in the second pixel area 50 included in the display area 10. The first gate electrode 150 may overlap the channel region of the active layer 130. In an embodiment, for example, the first gate electrode 150 may include a metal, an alloy, a metal nitride, a conductive metal oxide, a transparent conductive material, and the like. These may be used alone or in combination with each other.

At least one inorganic insulating layer (e.g., the second gate insulating layer 142) may be disposed in the display area 10 on the first gate insulating layer 141. The second gate insulating layer 142 may cover the first gate electrode 150 in the display area 10 and may not be disposed in the module-corresponding area 20. In an embodiment, for example, the second gate insulating layer 142 may sufficiently cover the first gate electrode 150 on the first gate insulating layer 141 and may have a substantially flat top surface without generating a step difference around the first gate electrode 150. In an embodiment, the second gate insulating layer 142 may cover the first gate electrode 150 on the first gate insulating layer 141 and may be disposed along a profile of the first gate electrode 150 with a uniform thickness.

The second gate insulating layer 142 may include an inorganic insulating material. In an embodiment, for example, the second gate insulating layer 142 may include silicon oxide, silicon nitride, silicon carbide, silicon oxynitride, silicon oxycarbide, and the like. These may be used alone or in combination with each other.

The second gate electrode 160 may be disposed in the display area 10, on the second gate insulating layer 142. Specifically, the second gate electrode 160 may be disposed in the second pixel area 50 included in the display area 10. The second gate electrode 160 may overlap the first gate electrode 150. The first gate electrode 150 and the second gate electrode 160 may function together as a capacitor. In an embodiment, for example, the second gate electrode 160 may include a metal, an alloy, a metal nitride, a conductive metal oxide, a transparent conductive material, and the like. These may be used alone or in combination with each other.

The interlayer insulating layer 170 may be disposed in the display area 10, on the second gate insulating layer 142. The interlayer insulating layer 170 may cover the second gate electrode 160 in the display area 10. In an embodiment, for example, the interlayer insulating layer 170 may sufficiently cover the second gate electrode 160 on the second gate insulating layer 142 and may have a substantially flat top surface without creating a step around the second gate electrode 160. In an embodiment, the interlayer insulating layer 170 may cover the second gate electrode 160 on the second gate insulating layer 142 and may be disposed along the profile of the second gate electrode 160 with a uniform thickness.

The interlayer insulating layer 170 may include an inorganic insulating material. In an embodiment, for example, the insulating interlayer 170 may include silicon oxide, silicon nitride, silicon carbide, silicon oxynitride, silicon oxycarbide, and the like. These may be used alone or in combination with each other. Here, the interlayer insulating layer 170 may be referred to as an inorganic insulating layer.

In a conventional display device, a phase difference between a first light L1 passing through a portion overlapping with a signal line 185, and a second light L2 passing through a portion not overlapping with the signal line 185, among the lights incident on a conventional module-corresponding area in which a functional member (e.g., a camera module) is disposed may occur. In this case, a flare phenomenon in which an image photographed by the camera module appears blurry may occur.

In an embodiment, the phase compensation layer 175 may be disposed in the module-corresponding area 20, on the etch stop layer 135. Specifically, the phase compensation layer 175 may be disposed in the transparent area 21 included in the module-corresponding area 20. The phase compensation layer 175 (e.g., light phase compensation layer) may serve to compensate for the phase difference between a first light L1 passing through a portion overlapping the signal line 185, and a second light L2 passing through a portion not overlapping the signal line 185 (e.g., adjacent to or spaced apart from the signal line 185), among the lights incident on the module-corresponding area 20 (e.g., external light). Accordingly, an occurrence of the flare phenomenon may be reduced.

The phase compensation layer 175 may include the same material as the interlayer insulating layer 170. That is, the phase compensation layer 175 may include an inorganic insulating material. In an embodiment, the phase compensation layer 175 may include silicon oxide, silicon nitride, and the like When the phase compensation layer 175 includes silicon oxide, a refractive index of the phase compensation layer 175 may be about 1.5. When the phase compensation layer 175 includes silicon nitride, a refractive index of the phase compensation layer 175 may be about 1.8 to about 2.0.

The source electrode 180 and a drain electrode 190 may be disposed in the display area 10, on the interlayer insulating layer 170. Specifically, the source electrode 180 and the drain electrode 190 may be disposed in the second pixel area 50 included in the display area 10. The source electrode 180 may be connected to the source region of the active layer 130 through a first contact hole formed by (or provided by) removing first portions of the first gate insulating layer 141, the second gate insulating layer 142 and the interlayer insulating layer 170. The drain electrode 190 may be connected to the drain region of the active layer 130 through a second contact hole formed by removing second portions of the first gate insulating layer 141, the second gate insulating layer 142 and the interlayer insulating layer 170. Each of the source electrode 180 and the drain electrode 190 may include a metal, an alloy, a metal nitride, a conductive metal oxide, a transparent conductive material, and the like. These may be used alone or in combination with each other.

The signal line 185 may be disposed on the phase compensation layer 175. The signal line 185 may overlap the phase compensation layer 175. As shown in FIG. 5, the signal line 185 may be electrically connected to the first lower electrode 225 through a contact hole formed by removing a portion of the planarization layer 210 positioned in the module-corresponding area 20. The signal line 185 may extend from the module-corresponding area 20 to the pixel circuit area 30, to be electrically connected to the first pixel circuit structure 501. That is, the signal line 185 connects the first emission structure 300 to the pixel circuit area 30.

A thickness of the signal line 185 along the thickness direction, may be smaller than a thickness of each of the source electrode 180 and the drain electrode 190. In an embodiment, for example, the signal line 185 may be substantially transparent.

The signal line 185 may include a conductive metal oxide, a transparent conductive material, and the like. Examples of materials that can be used for the signal line 185 may be indium tin oxide ("ITO"), indium zinc oxide ("IZO"), indium gallium oxide ("IGO"), tin oxide ("$SnO_2$"), zinc oxide ("ZnO"), and the like. These may be used alone or in combination with each other. In an embodiment, the signal line 185 may include indium tin oxide. When the signal line 185 includes indium tin oxide, the refractive index of the signal line 185 may be about 1.9 or more.

The planarization layer 210 may be disposed on the source electrode 180 and drain electrode 190 disposed in the display area 10 and on the etch stop layer 135 disposed in the module-corresponding area 20. That is, the planarization layer 210 may extend from the display area 10 to the module-corresponding area 20. The planarization layer 210 may cover the source electrode 180 and the drain electrode 190 in the display area 10, and may cover the phase compensation layer 175 and the signal line 185 in the module-corresponding area 20. The planarization layer 210 may have a relatively large thickness. The planarization layer 210 may include an organic insulating material or an inorganic insulating material. In an embodiment, the planarization layer 210 may include an organic insulating material. Examples of the organic insulating material that can be used for the planarization layer 210 may be a photoresist, a polyacrylic resin, a polyimide-based resin, a polyamide-based resin, a siloxane-based resin, an acrylic resin, an epoxy-based resin, and the like. These may be used alone or in combination with each other. Where the planarization layer 210 includes a substantially transparent siloxane-based resin, the planarization layer 210 may be referred to as an organic insulating layer.

In an embodiment, a refractive index of the planarization layer 210 may be greater than a refractive index of the phase compensation layer 175 and less than that of the signal line 185. In an embodiment, for example, a refractive index of the planarization layer 210 may be about 1.65. In this case, the phase compensation layer 175 may include silicon oxide, and the signal line 185 may include indium tin zinc oxide.

The second lower electrode 220 may be disposed in the display area 10, on the planarization layer 210. Specifically, the second lower electrode 220 may be disposed in the second pixel area 50 included in the display area 10. The second lower electrode 220 may be connected to the drain electrode 190 through a contact hole formed by removing a portion of the planarization layer 210. The second lower electrode 220 may be electrically connected to the semiconductor element 200. The second lower electrode 220 may include a metal, an alloy, a metal nitride, a conductive metal oxide, a transparent conductive material, and the like. These may be used alone or in combination with each other. For example, the second lower electrode 220 may have a stacked structure of ITO/Ag/ITO.

The first lower electrode 225 may be disposed in the module-corresponding area 20, on the planarization layer 210. Specifically, the first lower electrode 225 may be disposed in the first pixel area 40 included in the module-corresponding area 20. As described above, the first lower electrode 225 may be connected to the signal line 185 through a contact hole formed by removing a portion of the planarization layer 210 (see FIG. 5). The first lower electrode 225 may include a metal, an alloy, a metal nitride, a conductive metal oxide, a transparent conductive material, and the like. These may be used alone or in combination with each other. In addition, the first lower electrode 225 may have the same structure as the second lower electrode 220. In an embodiment, the first lower electrode 225 may have a structure different from a structure of the second lower electrode 220.

The pixel defining layer 250 may be disposed on a portion of the display area 10 and a portion of the module-corresponding area 20, on the planarization layer 210. That is, the pixel defining layer 250 may not be disposed in the transparent area 21. The pixel defining layer 250 may expose a portion of the second lower electrode 220 in the display area 10 to outside the pixel defining layer 250, and may expose a portion of the first lower electrode 225 in the module-corresponding area 20 to outside the pixel defining layer 250. In addition, an opening OP exposing layers in the transparent area 21 to outside the pixel defining layer 250 may be formed in (or defined by) the pixel defining layer 250. The pixel defining layer 250 may include an organic insulating material or an inorganic insulating material. In an embodiment, the pixel defining layer 250 may include an organic insulating material.

The second emission layer 230 may be disposed on the second lower electrode 220. The first emission layer 235 may be disposed on the first lower electrode 225. Each of the first emission layer 235 and the second emission layer 230 may be formed using at least one of emission materials that emit different color lights (e.g., red light, green light, blue light, and the like) according to sub-pixels.

The upper electrode 240 may be disposed in an entirety of the display area 10 and the module-corresponding area 20, on the substrate 110. The upper electrode 240 may be disposed along the profile of the first emission layer 235, the second emission layer 230, and the pixel defining layer 250. The upper electrode 240 may include a metal, an alloy, a metal nitride, a conductive metal oxide, a transparent conductive material, and the like. These may be used alone or in combination with each other.

The first inorganic thin film encapsulation layer 261 may be disposed on the upper electrode 240. The first inorganic thin film encapsulation layer 261 may be disposed in an entirety of the display area 10 and an entirety of the module-corresponding area 20. The first inorganic thin film encapsulation layer 261 may prevent (or reduce) the first emission structure 300 and the second emission structure 400 from being deteriorated due to penetration of moisture, oxygen, and the like. In addition, the first inorganic thin film encapsulation layer 261 may also function to protect the first emission structure 300 and the second emission structure 400 from external impact. In an embodiment, for example, the first inorganic thin film encapsulation layer 261 may include an inorganic insulating material having flexibility.

The organic thin film encapsulation layer 262 may be disposed on the first inorganic thin film encapsulation layer 261. The organic thin film encapsulation layer 262 may be disposed in an entirety of the display area 10 and the module-corresponding area 20. The organic thin film encapsulation layer 262 may improve the flatness of the display device 100, and may protect the first emission structure 300 and the second emission structure 400 together with the first inorganic thin film encapsulation layer 261. The organic thin film encapsulation layer 262 may include an organic insulating material having flexibility.

The second inorganic thin film encapsulation layer 263 may be disposed on the organic thin film encapsulation layer 262. The second inorganic thin film encapsulation layer 263 may be disposed in an entirety of the display area 10 and an entirety of the module-corresponding area 20. The second inorganic thin film encapsulation layer 263 may be used together with the first inorganic thin film encapsulation layer 261 to prevent the first emission structure 300 and the second emission structure 400 from being deteriorated due to penetration of moisture, oxygen, and the like.

In addition, the second inorganic thin film encapsulation layer 263 may also perform a function to protect the first emission structure 300 and the second emission structure 400 together with the first inorganic thin film encapsulation layer 261 and the organic thin film encapsulation layer 262 from external impact. In an embodiment, for example, the second inorganic thin film encapsulation layer 263 may include an inorganic insulating material having flexibility.

In one or more embodiment of the display device 100, as the phase compensation layer 175 including an inorganic insulating material is disposed in the module-corresponding area 20, on the etch stop layer 135, an occurrence of the flare phenomenon may be reduced.

However, in a relatively large area display device, in the process of patterning the phase compensation layer 175, a thickness of the phase compensation layer 175 may become non-uniform.

In one or more embodiment of the display device 100, as the etch stop layer 135 including a transparent material is disposed in the module-corresponding area 20, between the substrate 110 and the phase compensation layer 175, a thickness non-uniformity of the phase compensation layer 175 in the large area display device may be improved.

FIGS. 7, 8, 9, 10, 11, 12, 13, 14, 15, and 16 are cross-sectional views illustrating embodiments of structures in a method of manufacturing (or providing) the display device 100 of FIG. 6.

Figure 7:
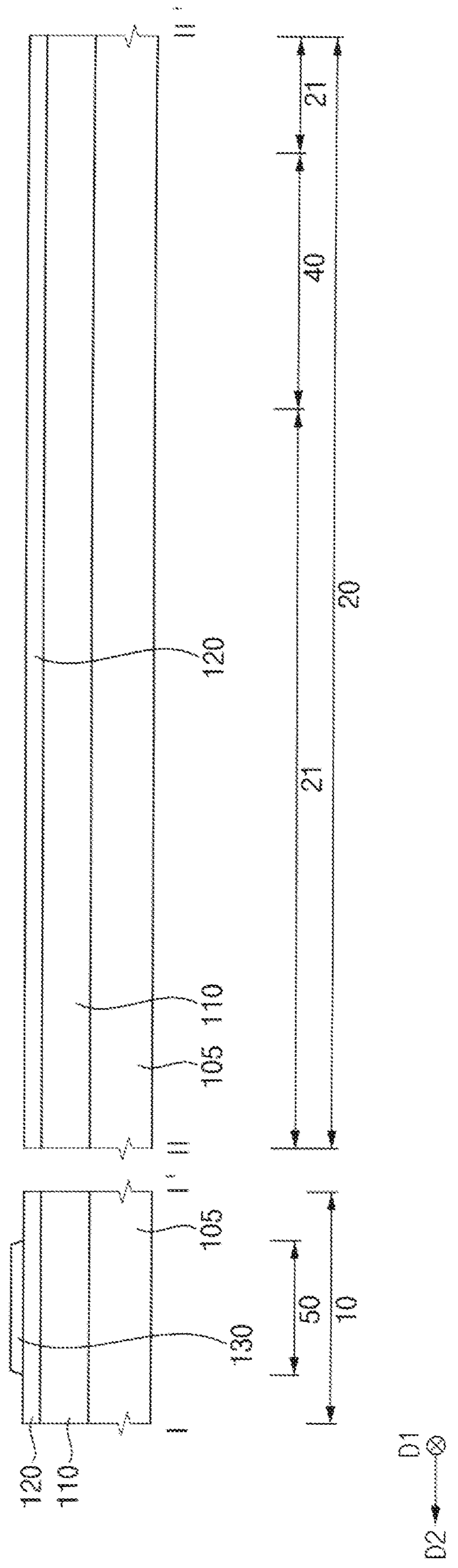
FIGS. 7, 8, 9, 10, 11, 12, 13, 14, 15, and 16 are cross-sectional views illustrating embodiments of structures provided by a method of manufacturing the display device of FIG. 6.

Referring to FIG. 7, the substrate 110 including a transparent material may be formed on a rigid glass substrate 105 (e.g., a base layer). The substrate 110 may be formed using a flexible transparent resin substrate. In an embodiment, the substrate 110 may be formed using a quartz substrate, a synthetic quartz substrate, a glass substrate, and the like. In this case, the rigid glass substrate 105 may be omitted.

In an embodiment, for example, when the substrate 110 includes a transparent material, since the substrate 110 is thin and flexible, the substrate 110 may be formed on the rigid glass substrate 105 to support the formation of the semiconductor element 200, the first emission structure 300, the second emission structure 400, and the thin film encapsulation structure 260, and the like. As will be described later, after the thin film encapsulation structure 260 is formed, the rigid glass substrate 105 may be removed.

The substrate 110 may include the display area 10, the module-corresponding area 20, and the pixel circuit area 30.

The buffer layer 120 may be formed on the substrate 110. The buffer layer 120 may be formed in an entirety of the display area 10 and an entirety of the module-corresponding area 20. According to the type of the substrate 110, two or more buffer layers 120 may be formed on the substrate 110 or the buffer layer 120 may not be formed. The buffer layer 120 may be formed using silicon oxide, silicon nitride, and the like.

The active layer 130 may be formed in the display area 10 on the buffer layer 120. The active layer 130 may be formed using a metal oxide semiconductor, an inorganic semiconductor, or an organic semiconductor. The active layer 130 may include a source region, a drain region, and a channel region positioned between the source region and the drain area.

Figure 8:
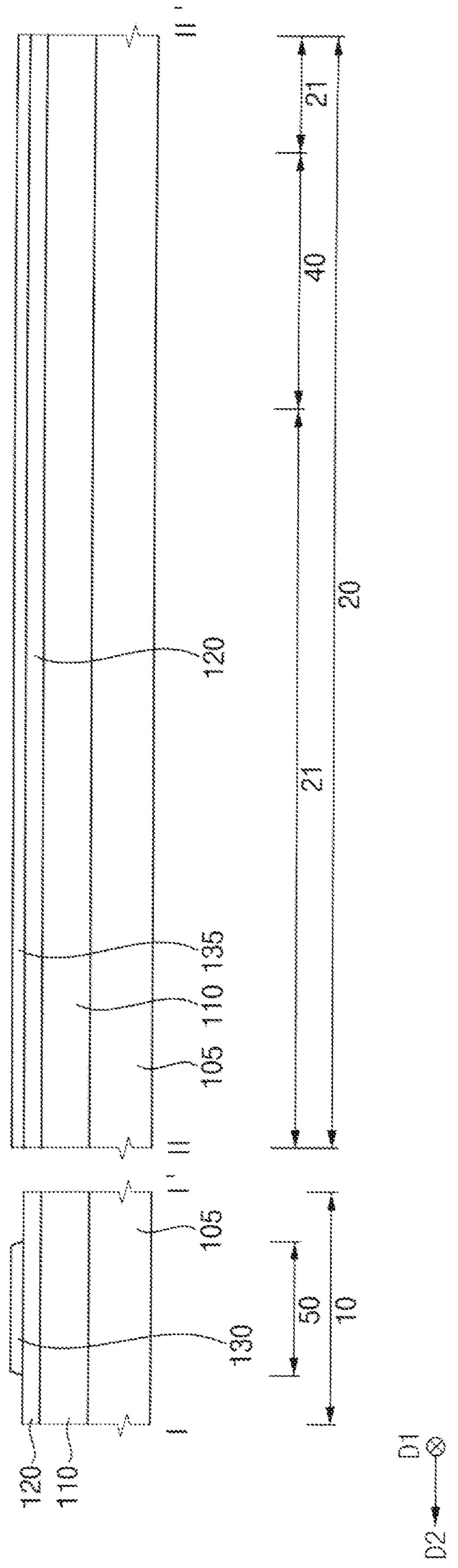

Referring to FIG. 8, the etch stop layer 135 may be formed in the module-corresponding area 20, on the buffer layer 120. That is, the etch stop layer 135 may be formed on the same layer as the active layer 130. In addition, the etch stop layer 135 may be formed in an entirety of the module-corresponding area 20. In an embodiment, for example, the etch stop layer 135 may be formed using a transparent material. In an embodiment, the etch stop layer 135 may be formed using indium gallium zinc oxide, amorphous silicon, and the like.

The etch stop layer 135 may be formed in the same process as the active layer 130. That is, the etch stop layer 135 may be simultaneously formed using the same material as the active layer 130. In an embodiment, the etch stop layer 135 may be formed in a process different from a process of the active layer 130. In an embodiment, for example, after the active layer 130 is formed, the etch stop layer 135 may be formed. In this case, the etch stop layer 135 may be formed using a material different from a material of the active layer 130.

Figure 9:
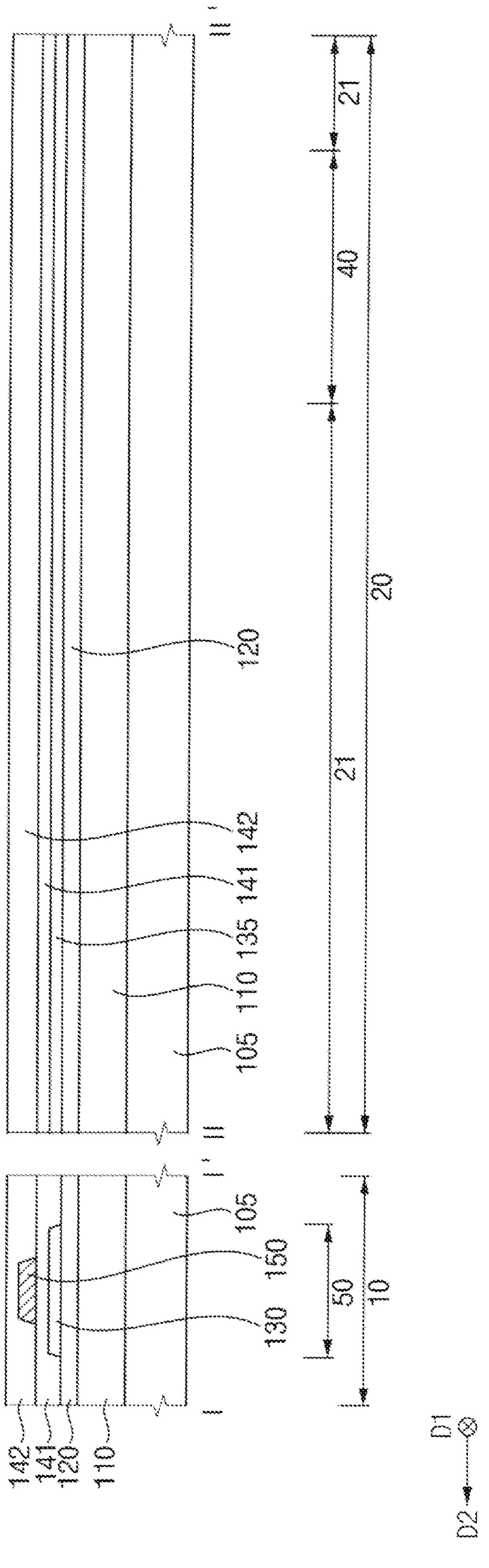

Referring to FIG. 9, the first gate insulating layer 141 may be formed on the buffer layer 120. The first gate insulating layer 141 may cover the active layer 130 in the display area 10 and may extend to the module-corresponding area 20. That is, the first gate insulating layer 141 may be formed in an entirety of the display area 10 and an entirety of the module-corresponding area 20. The first gate insulating layer 141 may be formed using silicon oxide, silicon nitride, silicon oxynitride, and the like.

The first gate electrode 150 may be formed in the display area 10 on the first gate insulating layer 141. The first gate electrode 150 may be formed to overlap the channel region of the active layer 130. The first gate electrode 150 may be formed using a metal, an alloy, a metal nitride, a conductive metal oxide, a transparent conductive material, and the like.

The second gate insulating layer 142 may be formed on the first gate insulating layer 141. The second gate insulating layer 142 may cover the first gate electrode 150 in the display area 10 and may extend to the module-corresponding area 20. That is, the second gate insulating layer 142 may be formed in an entirety of the display area 10 and an entirety of the module-corresponding area 20. The second gate insulating layer 142 may be formed using silicon oxide, silicon nitride, silicon oxynitride, and the like.

Figure 10:
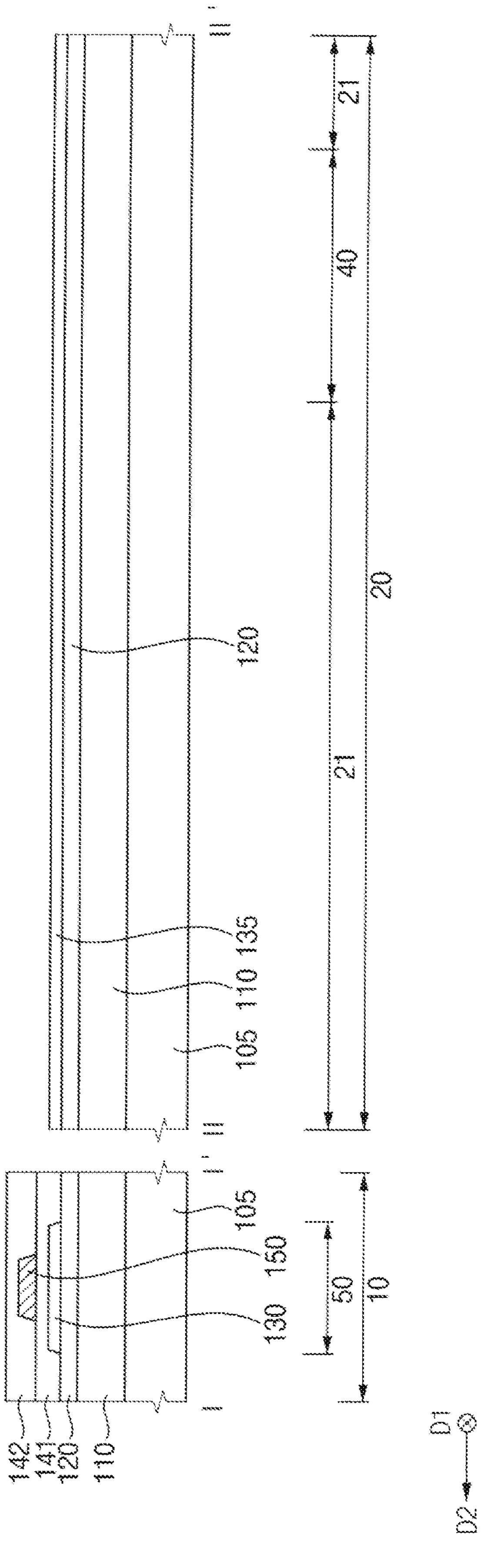

Referring to FIG. 10, the first gate insulating layer 141 and the second gate insulating layer 142 disposed in the module-corresponding area 20 may be removed. Removal of the first gate insulating layer 141 and the second gate insulating layer 142 from the module-corresponding area 20 exposes the etch stop layer 135 to outside the first gate insulating layer 141 and the second gate insulating layer 142.

Figure 11:
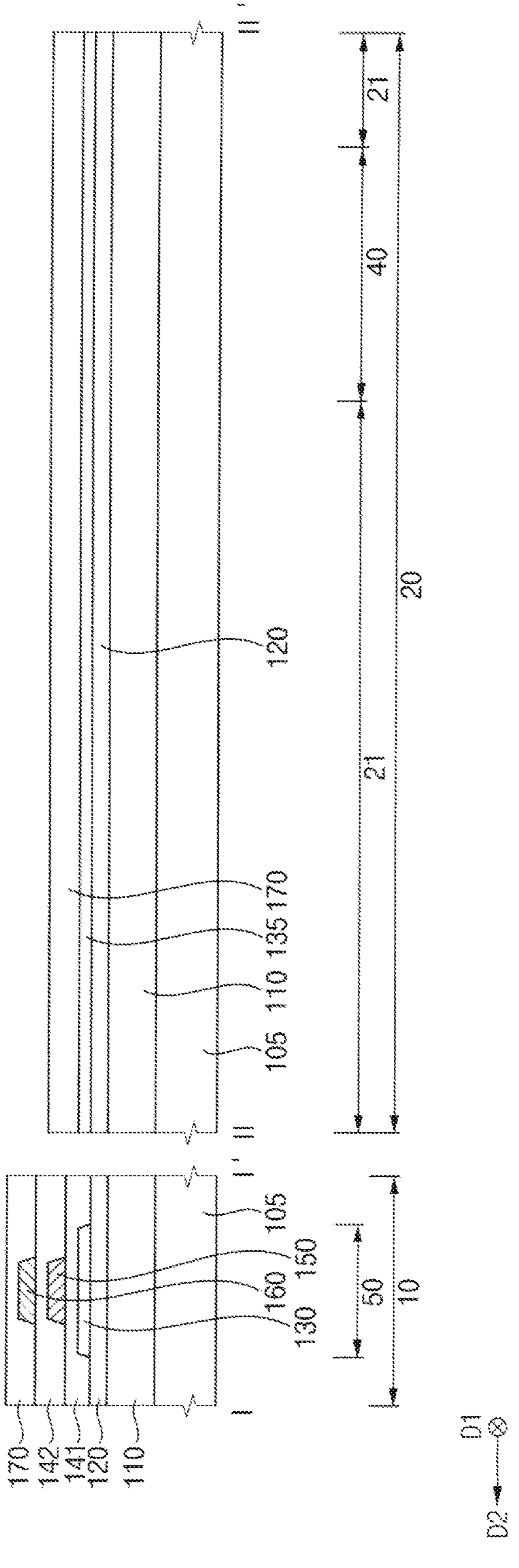

Referring to FIG. 11, the second gate electrode 160 may be formed in the display area 10, on the second gate insulating layer 142. The second gate electrode 160 may overlap the first gate electrode 150. The second gate electrode 160 may be formed using a metal, an alloy, a metal nitride, a conductive metal oxide, a transparent conductive material, and the like.

The interlayer insulating layer 170 may be disposed on the second gate insulating layer 142. The interlayer insulating layer 170 may cover the second gate electrode 160 in the display area 10 and may extend to the module-corresponding area 20. That is, the interlayer insulating layer 170 may be formed in an entirety of the display area 10 and an entirety of the module-corresponding area 20. The interlayer insulating layer 170 may be formed using silicon oxide, silicon nitride, silicon oxynitride, and the like.

Figure 12:
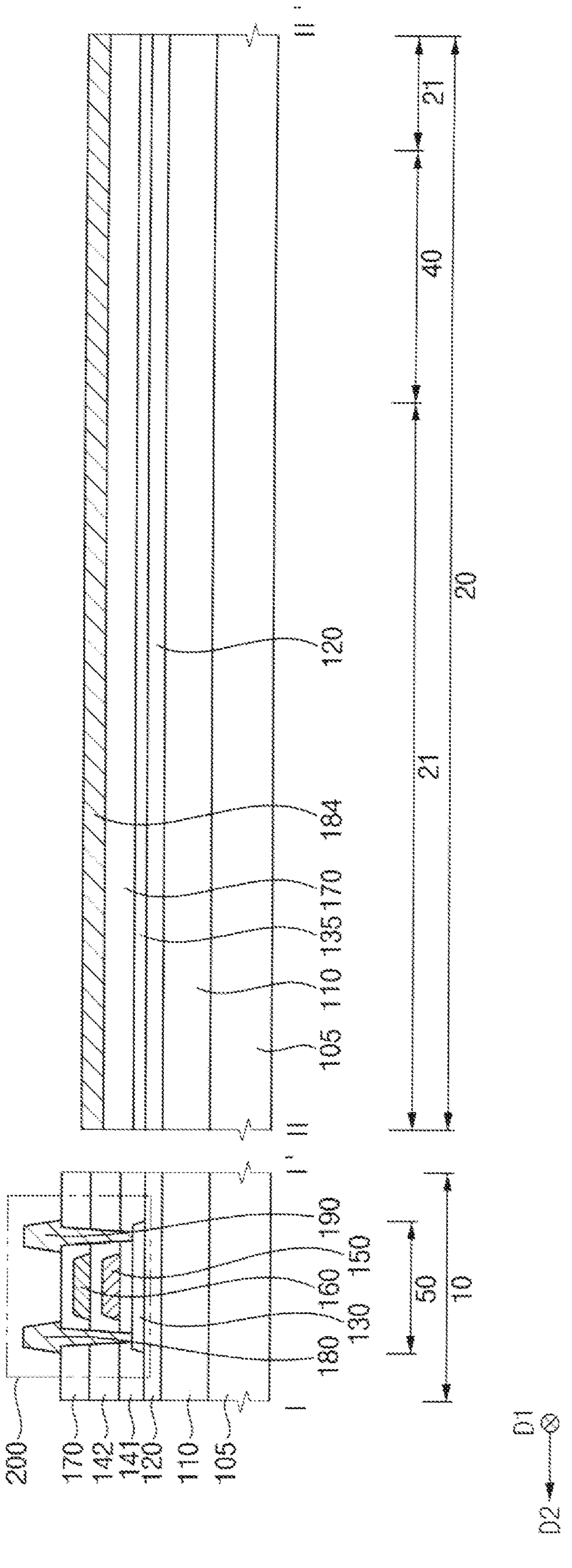

Referring to FIG. 12, the source electrode 180 and the drain electrode 190 may be formed in the display area 10 on the interlayer insulating layer 170. The source electrode 180 may be connected to the source region of the active layer 130 through a first contact hole formed by removing a first portion of each of the first gate insulating layer 141, the second gate insulating layer 142 and the interlayer insulating layer 170. The drain electrode 190 may be connected to the drain region of the active layer 130 through a second contact hole formed by removing a second portion of each of the first gate insulating layer 141, the second gate insulating layer 142 and the interlayer insulating layer 170. Each of the source electrode 180 and the drain electrode 190 may be formed using a metal, an alloy, a metal nitride, a conductive metal oxide, a transparent conductive material, and the like.

Accordingly, the semiconductor element 200 including the active layer 130, the first gate electrode 150, the second gate electrode 160, the source electrode 180 and the drain electrode 190, may be formed in the second pixel area 50.

A conductive film 184 may be formed in the module-corresponding area 20, on the interlayer insulating layer 170. The conductive film 184 may be formed using a conductive metal oxide, a transparent conductive material, and the like. In an embodiment, for example, the conductive film 184 may be formed using ITO, IZO, IGO, $SnO_2$, ZnO, and the like.

Figure 13:
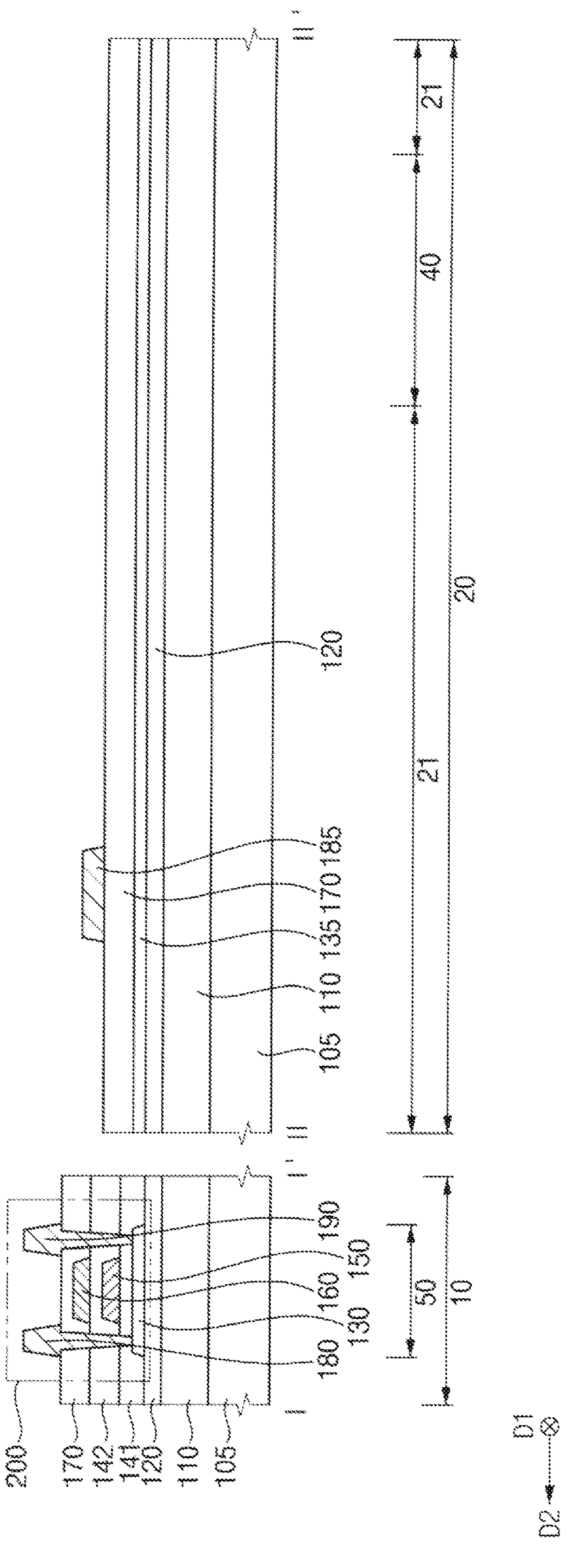

Referring to FIGS. 12 and 13, the signal line 185 may be formed by patterning the conductive film 184 (e.g., signal line material layer). In an embodiment, the signal line 185, the source electrode 180, and the drain electrode 190 may be formed on the same layer, but is not limited thereto, and may be formed in different processes using different materials from each other. In an embodiment, for example, after the source electrode 180 and the drain electrode 190 are formed, the signal line 185 may be formed.

Figure 14:
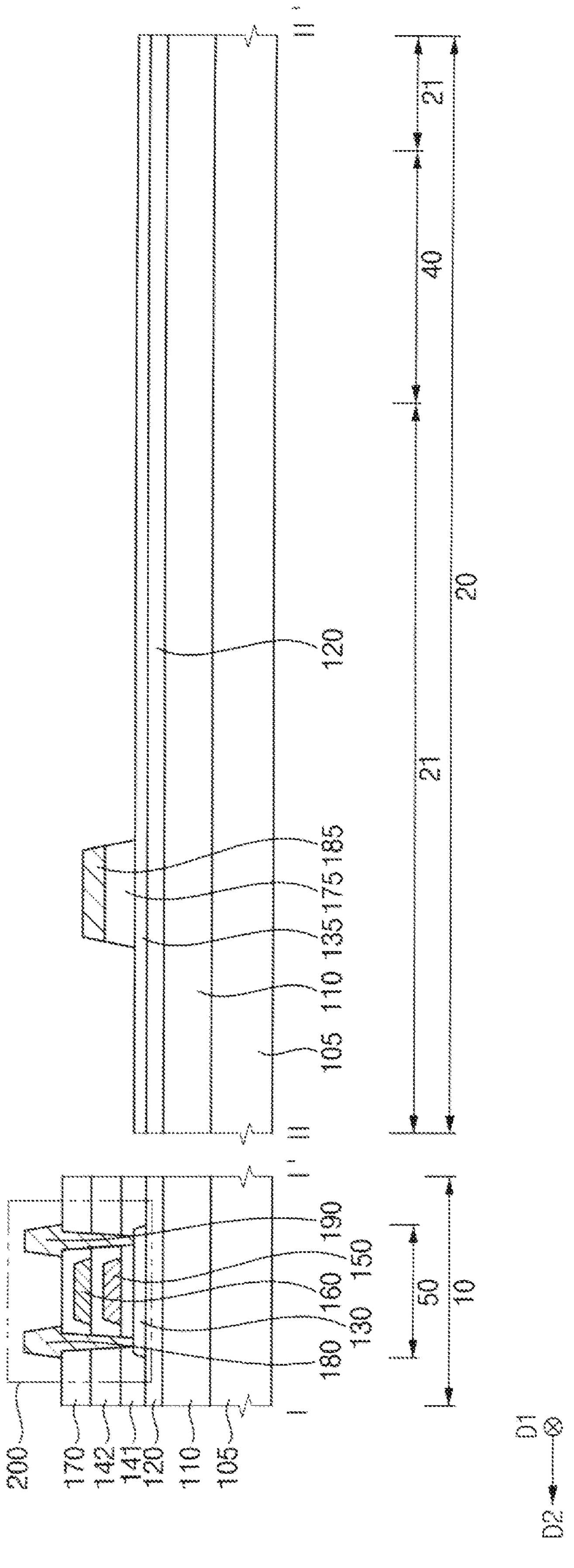

Referring to FIGS. 13 and 14, the phase compensation layer 175 may be formed by patterning the interlayer insulating layer 170 disposed in the module-corresponding area 20. Specifically, the phase compensation layer 175 may be formed at a location corresponding to the signal line 185, using the signal line 185 as a mask. That is, after the phase compensation layer 175 (e.g., phase compensation pattern) is formed, an upper surface of the etch stop layer 135 that does not overlap the signal line 185 in the module-corresponding area 20, may be exposed to outside the interlayer insulating layer 170 (or the phase compensation pattern) and the signal line 185. However, in an embodiment, a portion of the interlayer insulating layer 170 that does not overlap the signal line 185 may remain in the module-corresponding area 20.

In an embodiment, for example, the phase compensation layer 175 may be formed using silicon oxide, silicon nitride, and the like. That is, the phase compensation layer 175 may be formed using the same material as the interlayer insulating layer 170.

Figure 15:
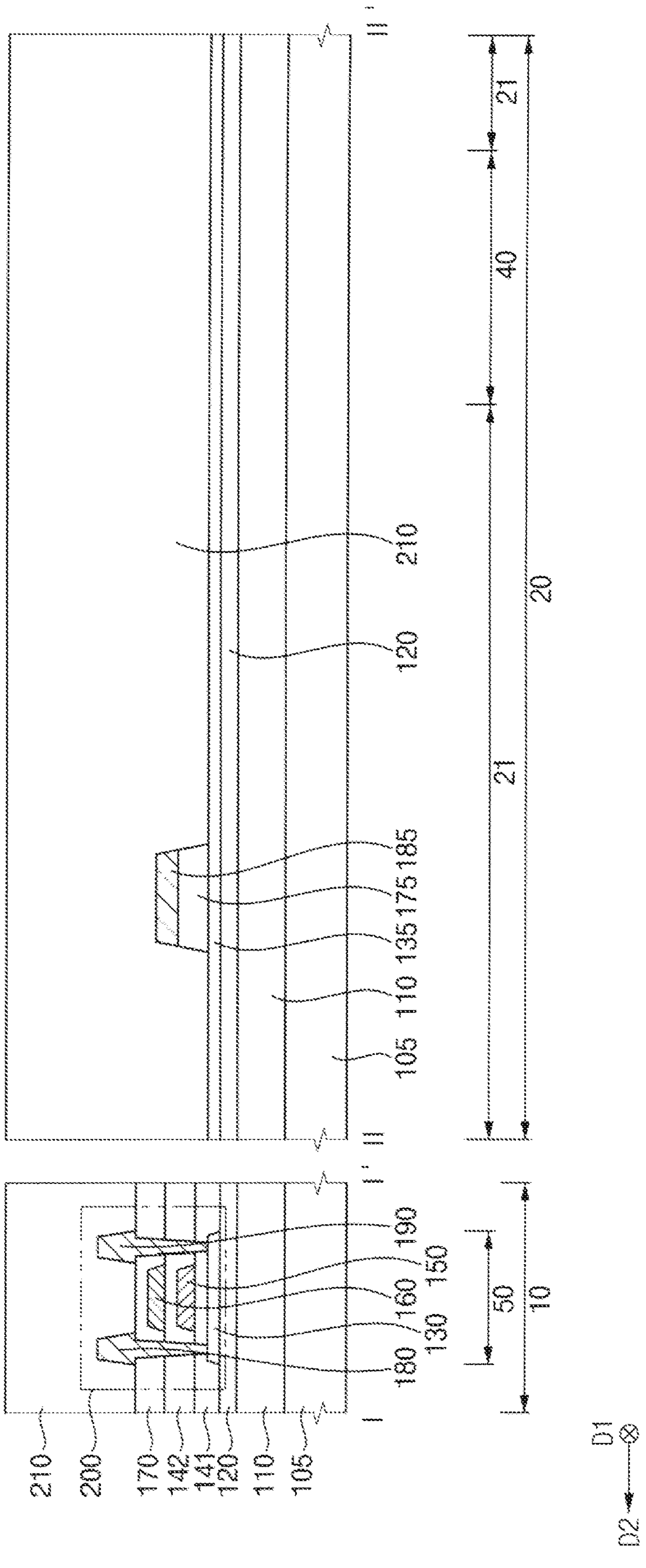

Referring to FIG. 15, the planarization layer 210 may be formed on the interlayer insulating layer 170 and the etch stop layer 135. That is, the planarization layer 210 may cover the source electrode 180 and the drain electrode 190 in the display area 10 and may extend to the module-corresponding area 20. The planarization layer 210 may cover the phase compensation layer 175 and the signal line 185 in the module-corresponding area 20. The planarization layer 210 may be formed using a photoresist, a polyacrylic resin, a polyimide-based resin, a polyamide-based resin, a siloxane-based resin, an acrylic resin, an epoxy-based resin, and the like. The planarization layer 210 may be formed using a substantially transparent siloxane-based resin.

Figure 16:
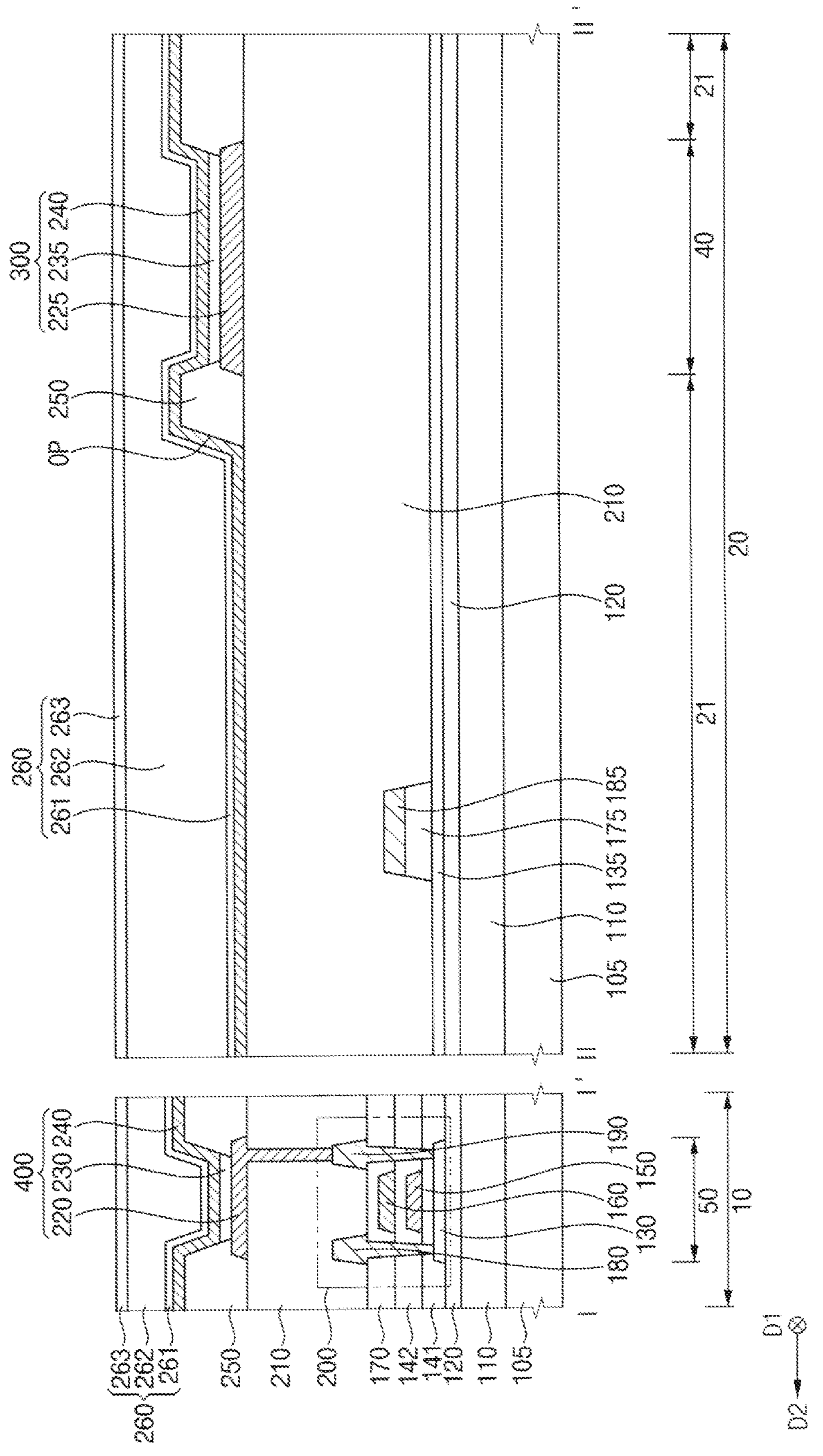

Referring to FIG. 16, the second lower electrode 220 may be formed in the display area 10, on the planarization layer 210. The first lower electrode 225 may be formed in the module-corresponding area 20, on the planarization layer 210. The second lower electrode 220 may be connected to the drain electrode 190 through a contact hole formed by removing a portion of the planarization layer 210. The first lower electrode 225 may be connected to the signal line 185 through a contact hole formed by removing a portion of the planarization layer 210 (see box surrounding 'x' in FIG. 5). Each of the first lower electrode 225 and the second lower electrode 220 may be formed using a metal, an alloy, a metal nitride, a conductive metal oxide, a transparent conductive material, and the like. In an embodiment, for example, each of the first lower electrode 225 and the second lower electrode 220 may have a stacked structure of ITO/Ag/ITO.

The pixel defining layer 250 may be formed in the display area 10 and a portion of the module-corresponding area 20, on the planarization layer 210. The pixel defining layer 250 may expose a portion of the second lower electrode 220 in the display area 10, and may expose a portion of the first lower electrode 225 in the module-corresponding area 20. In addition, the opening OP exposing layers in the transparent area 21 may be formed in the pixel defining layer 250. The pixel defining layer 250 may be formed using an organic insulating material.

The second emission layer 230 may be formed on the second lower electrode 220, and the first emission layer 235 may be formed on the first lower electrode 225. Each of the first emission layer 235 and the second emission layer 230 may be formed using at least one of light emitting materials capable of emitting light of different colors according to sub-pixels.

The upper electrode 240 may be formed in an entirety of the display area 10 and an entirety of the module-corresponding area 20 on the substrate 110. The upper electrode 240 may be formed along the profile of the first emission layer 235, the second emission layer 230, and the pixel defining layer 250. The upper electrode 240 may be formed using a metal, an alloy, a metal nitride, a conductive metal oxide, a transparent conductive material, and the like.

Accordingly, the second emission structure 400 including the second lower electrode 220, the second emission layer 230 and the upper electrode 240 may be formed in the second pixel area 50, and the first emission structure 300 including the first lower electrode 225, the first emission layer 235 and the upper electrode 240 may be formed in the first pixel area 40.

The first inorganic thin film encapsulation layer 261 may be formed in the display area 10 and the module-corresponding area 20, on the upper electrode 240. In an embodiment, for example, the first inorganic thin film encapsulation layer 261 may be formed using an inorganic insulating material having flexibility. The organic thin film encapsulation layer 262 may be formed in the display area 10 and the module-corresponding area 20, on the first inorganic thin film encapsulation layer 261. In an embodiment, for example, the organic thin film encapsulation layer 262 may be formed using an organic insulating material having flexibility. The second inorganic thin film encapsulation layer 263 may be formed on the organic thin film encapsulation layer 262. The second inorganic thin film encapsulation layer 263 may be formed using an inorganic insulating material having flexibility.

Accordingly, the thin film encapsulation structure 260 including the first inorganic thin film encapsulation layer 261, the organic thin film encapsulation layer 262, and the second inorganic thin film encapsulation layer 263 may be formed. After the thin film encapsulation structure 260 is formed, the glass substrate 105 may be removed from the substrate 110 to expose a lower surface of the substrate 110.

Referring back to FIG. 6, the functional module FM may be formed in the module-corresponding area 20, on the lower surface of the substrate 110. In an embodiment, for example, the functional module FM may include the camera module and the like.

Accordingly, the display device 100 shown in FIGS. 1, 2, 3, 4, 5, and 6 may be provided.

Figure 17:
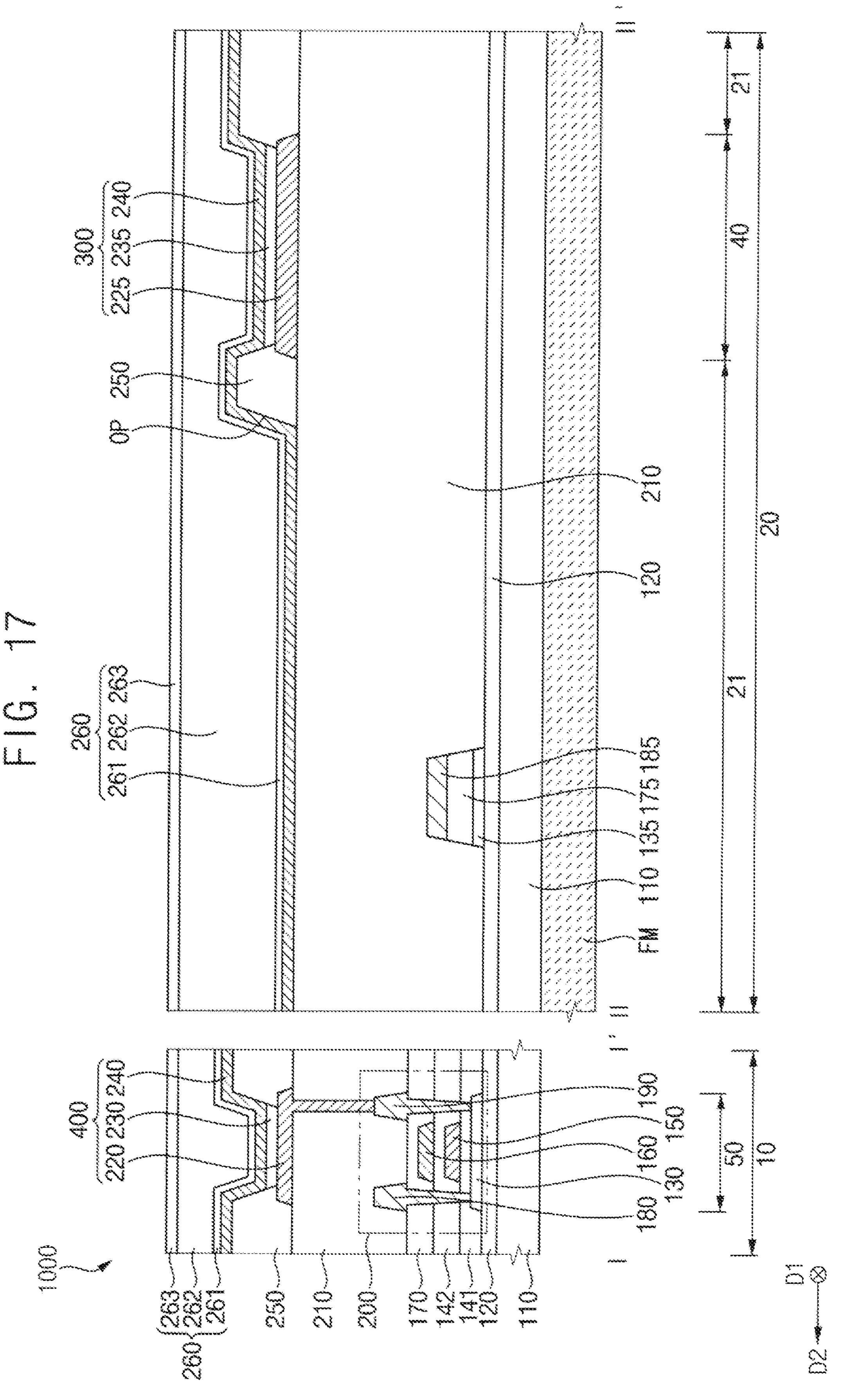
FIG. 17 is a cross-sectional view illustrating an embodiment of a display device.

FIG. 17 is a cross-sectional view illustrating an embodiment of a display device 1000.

Referring to FIG. 17, the display device 1000 may include a functional module FM, a substrate 110, a buffer layer 120, a semiconductor element 200, a first gate insulating layer 141, a second gate insulating layer 142, an interlayer insulating layer 170, a phase compensation layer 175, a signal line 185, an etch stop layer 135, a planarization layer 210, a pixel defining layer 250, a first emission structure 300, a second emission structure 400 and a thin film encapsulation structure 260. The display device 1000 of FIG. 17 may be substantially the same as or similar to the display device 100 described with reference to FIG. 6 except for the etch stop layer 135. Hereinafter, overlapping descriptions will be omitted.

The etch stop layer 135 may be disposed in the module-corresponding area 20, on the buffer layer 120. In an embodiment, the etch stop layer 135 may be patterned to define an etch stop pattern which overlaps each of the phase compensation layer 175 and the signal line 185. In this case, the etch stop layer 135 may include amorphous silicon. The buffer layer 120 may be exposed to outside the phase compensation layer 175, the signal line 185 and the etch stop layer 135, within the module-corresponding area 20.

Although the etch stop layer 135 and the active layer 130 are formed on the same layer, the invention is not limited thereto, and the etch stop layer 135 and the active layer 130 may be formed using different materials and in different processes. In an embodiment, for example, after the active layer 130 is formed, the etch stop layer 135 may be formed. Specifically, after the phase compensation layer 175 is patterned to provide a phase compensation pattern, the etch stop layer 135 may be patterned to provide an etch stop pattern.

Figure 18:
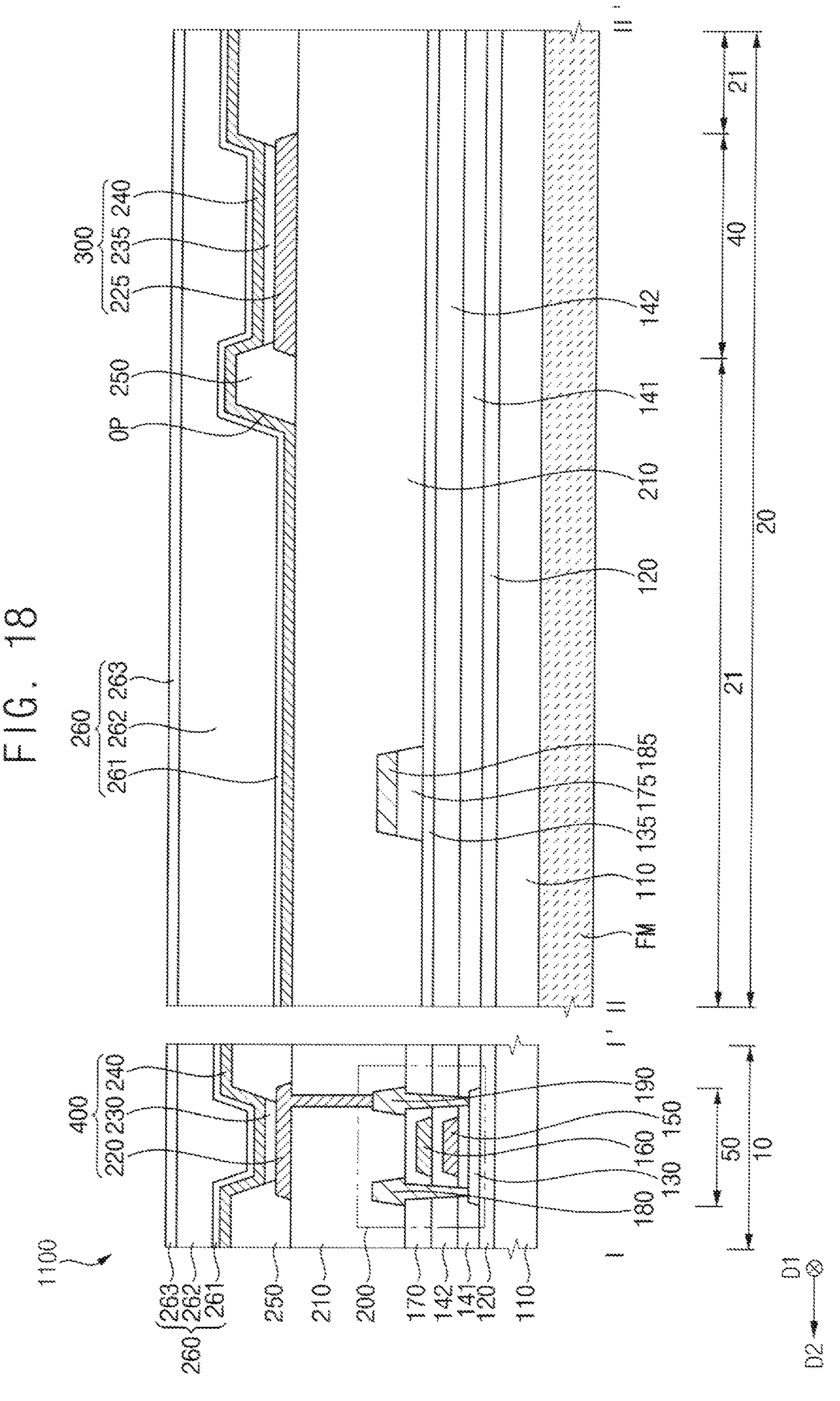
FIG. 18 is a cross-sectional view illustrating an embodiment of a display device.

FIG. 18 is a cross-sectional view illustrating an embodiment of a display device 1100.

Referring to FIG. 18, the display device 1100 may include a functional module FM, a substrate 110, a buffer layer 120, a semiconductor element 200, a first gate insulating layer 141, a second gate insulating layer 142, an interlayer insulating layer 170, a phase compensation layer 175, a signal line 185, an etch stop layer 135, a planarization layer 210, a pixel defining layer 250, a first emission structure 300, a second emission structure 400, a thin film encapsulation structure 260. The display device 1100 of FIG. 18 may be substantially the same as or similar to the display device 100 described with reference to FIG. 6 except for the first gate insulating layer 141 and the second gate insulating layer 142 disposed in the module-corresponding area 20. Hereinafter, overlapping descriptions will be omitted.

At least one inorganic insulating layer (e.g., the first gate insulating layer 141, the second gate insulating layer 142, and the like) may be disposed on the buffer layer 120. In an embodiment, for example, the first gate insulating layer 141 may be disposed on the buffer layer 120, and the second gate insulating layer 142 may be disposed on the first gate insulating layer 141. In an embodiment, the first gate insulating layer 141 and the second gate insulating layer 142 may be disposed in an entirety of the display area 10 and an entirety of the module-corresponding area 20. That is, the first gate insulating layer 141 and the second gate insulating layer 142 in the module-corresponding area 20 may remain on the substrate 110, without being removed. In an embodiment, each of the first gate insulating layer 141 and the second gate insulating layer 142 may have a multilayer structure including a plurality of insulating layers.

The etch stop layer 135 may be disposed in the module-corresponding area 20, on the second gate insulating layer 142. In addition, the etch stop layer 135 may be disposed in an entirety of the module-corresponding area 20 to face the substrate with both the first gate insulating layer 141 and the second gate insulating layer 142 therebetween.

In an embodiment, the etch stop layer 135 may be formed in a process different from a process of the active layer 130. In an embodiment, for example, after the active layer 130 is formed, the etch stop layer 135 may be formed. In this case, the etch stop layer 135 and the active layer 130 may include different materials.

Figure 19:
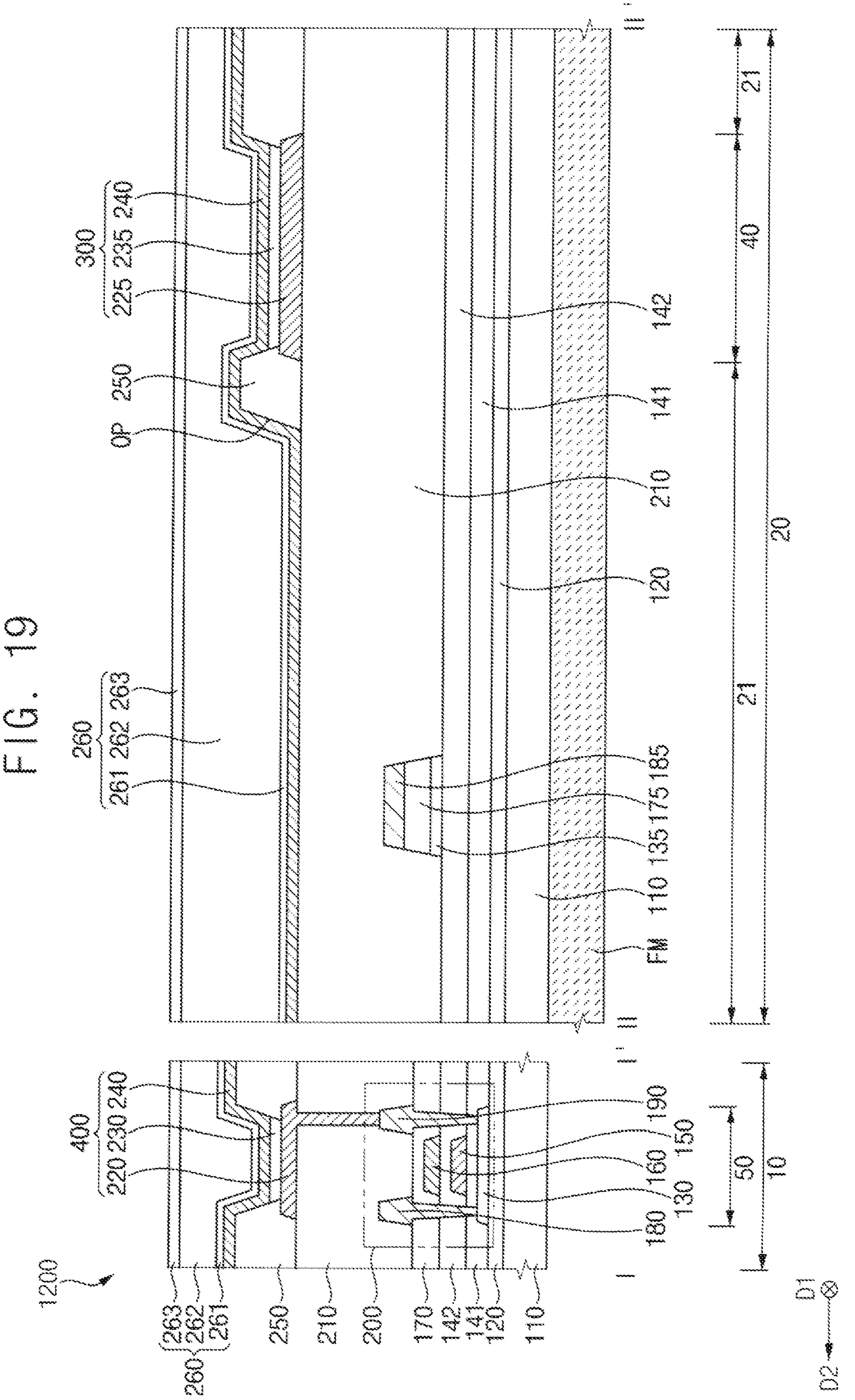
FIG. 19 is a cross-sectional view illustrating an embodiment of a display device.

FIG. 19 is a cross-sectional view illustrating an embodiment of a display device 1200.

Referring to FIG. 19, the display device 1200 may include a functional module FM, a substrate 110, a buffer layer 120, a semiconductor element 200, a first gate insulating layer 141, and a second gate insulating layer 142, an interlayer insulating layer 170, a phase compensation layer 175, a signal line 185, an etch stop layer 135, a planarization layer 210, a pixel defining layer 250, a first emission structure 300, a second emission structure 400 and a thin film encapsulation structure 260. The display device 1200 of FIG. 18 may be substantially the same as or similar to the display device 1100 described with reference to FIG. 18 except for the etch stop layer 135 disposed in the module-corresponding area 20. Hereinafter, overlapping descriptions will be omitted.

The etch stop layer 135 may be disposed in the module-corresponding area 20, on the second gate insulating layer 142. In addition, referring back to FIG. 17, the etch stop layer 135 may be patterned to overlap each of the phase compensation layer 175 and the signal line 185.

One or more embodiment of the present disclosure can be applied to various display devices that may include an image-generating device. In an embodiment, for example, the present disclosure can be applied to high-resolution smartphones, mobile phones, smart pads, smart watches, tablet PCs, in-vehicle navigation systems, televisions, computer monitors, notebook computers, and the like.

The foregoing is illustrative of embodiments and is not to be construed as limiting thereof. Although embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of various embodiments and is not to be construed as limited to the embodiments disclosed, and that modifications to the disclosed embodiments, as well as other embodiments, are intended to be included within the scope of the appended claims.

What is claimed is:

1. A display device comprising:

a display area, a pixel circuit area adjacent to the display area, and a functional module area between the display area and the pixel circuit area;

an inorganic material layer which is in the display area and in the functional module area and defines both:

an inorganic insulating layer in the display area; and a light phase compensation pattern in the functional module area;

a signal line corresponding to the light phase compensation pattern, in the functional module area, and extending from the functional module area to the pixel circuit area; and an organic insulating layer facing the inorganic insulating layer, in the display area, and extending from the display area to the functional module area to face the light phase compensation pattern with the signal line therebetween.

2. The display device of claim 1, further comprising:

an etch stop layer facing the signal line with the light phase compensation pattern therebetween, in the functional module area, and the etch stop layer in the functional module area including a transparent material.

3. The display device of claim 2, wherein each of the light phase compensation pattern and the etch stop layer has an etch rate, and the etch rate of the etch stop layer is smaller than the etch rate of the light phase compensation pattern.

4. The display device of claim 2, wherein the etch stop layer includes indium gallium zinc oxide or amorphous silicon.

5. The display device of claim 4, wherein the etch stop layer is in an entirety of the functional module area.

6. The display device of claim 1, wherein the signal line includes a conductive metal oxide or a transparent conductive material.

7. The display device of claim 6, wherein the transparent conductive material includes indium tin oxide, indium zinc oxide or indium gallium oxide.

8. The display device of claim 1, wherein the inorganic material layer includes silicon oxide or silicon nitride.

9. The display device of claim 1, wherein within the functional module area, each of the organic insulating layer, the light phase compensation pattern and the signal line has a refractive index, and the refractive index of the organic insulating layer is greater than the refractive index of the light phase compensation pattern and smaller than the refractive index of the signal line.

10. The display device of claim 9, wherein the refractive index of the signal line is about 1.9 or more.

11. The display device of claim 1, further comprising within the functional module area:

a substrate facing the signal line with the light phase compensation pattern therebetween, and a functional module which provides a function of the display device, with light, the functional module facing the light phase compensation pattern with the substrate therebetween.

12. The display device of claim 11, wherein the functional module includes a camera module, a face recognition sensor module, a pupil recognition sensor module, an acceleration sensor module, a proximity sensor module, an infrared sensor module or an illuminance sensor module.

13. The display device of claim 1, further comprising:

a pixel circuit structure in the pixel circuit area and including a semiconductor element; and an emission structure in the functional module area and connected to the pixel circuit structure of the pixel circuit area.

14. The display device of claim 13, wherein the signal line electrically connects the pixel circuit structure of the pixel circuit area to the emission structure of the functional module area.

15. A display device comprising:

a display area, a pixel circuit area adjacent to the display area, and a functional module area between the display area and the pixel circuit area and including a functional module which provides a function of the display device, with light;

an inorganic material layer which is in both the display area and the functional module area and defines both:

an inorganic insulating layer in the display area; and a light phase compensation pattern in the functional module area;

a signal line corresponding to the light phase compensation pattern, in the functional module area, and extending from the functional module area to the pixel circuit area; and an organic insulating layer facing the inorganic insulating layer, in the display area, and extending from the display area to the functional module area to face the inorganic insulating layer with each of the light phase compensation pattern and the signal line therebetween.

16. The display device of claim 15, further comprising:

an etch stop layer between the inorganic insulating layer and the light phase compensation pattern, in the functional module area, and the etch stop layer in the functional module area including a transparent material.

17. The display device of claim 16, wherein each of the light phase compensation pattern and the etch stop layer has an etch rate, and the etch rate of the etch stop layer is smaller than the etch rate of the light phase compensation pattern.

18. The display device of claim 16, wherein the etch stop layer includes indium gallium zinc oxide or amorphous silicon.

19. The display device of claim 15, wherein the inorganic material layer includes silicon oxide or silicon nitride.

* * * * *